US012563777B2

(12) United States Patent
Wang et al.

(10) Patent No.: US 12,563,777 B2
(45) Date of Patent: Feb. 24, 2026

(54) COMPLEMENTARY FIELD EFFECT TRANSISTOR WITH OBLIQUE CONDUCTIVE THROUGH SUBSTRATE LAYER

(71) Applicant: Taiwan Semiconductor Manufacturing Co., Ltd., Hsinchu (TW)

(72) Inventors: Hsin-Chih Wang, Hsinchu (TW); Yu-Tien Shen, Hsinchu (TW); Yu-Chen Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 279 days.

(21) Appl. No.: 18/320,480

(22) Filed: May 19, 2023

(65) Prior Publication Data

US 2024/0387651 A1 Nov. 21, 2024

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 64/01* | (2025.01) |

(Continued)

(52) U.S. Cl.
CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/017* (2025.01);

(Continued)

(58) Field of Classification Search
CPC .. H10D 30/6729; H10D 30/014; H10D 30/43; H10D 30/6735; H10D 30/6757; H10D 62/121; H10D 64/017; H10D 84/017; H10D 84/0186; H10D 84/038; H10D 84/85; H10D 84/0149
See application file for complete search history.

(56) References Cited

U.S. PATENT DOCUMENTS 11,342,227 B2 * 5/2022 Lilak ................. H01L 21/31116
2012/0286829 A1 11/2012 Yamji
(Continued)

FOREIGN PATENT DOCUMENTS

TW 201428931 A 7/2014
TW 202119627 A 5/2021
(Continued)

*Primary Examiner* — Allison Bernstein
(74) *Attorney, Agent, or Firm* — Seed IP Law Group LLP

(57) ABSTRACT

A device includes: a complementary transistor including: a first transistor having a first source/drain region; and a second transistor above the first transistor in a vertical direction, and having a second source/drain region, the second transistor being offset from the first transistor in a first direction that is perpendicular to the vertical direction; a first source/drain contact electrically coupled to the first source/drain region; a second source/drain contact electrically coupled to the second source/drain region; and an interconnect structure electrically coupled to the first source/drain contact and the second source/drain contact, and including an oblique portion that extends from the first source/drain contact to the second source/drain contact at an offset angle from the vertical direction.

20 Claims, 18 Drawing Sheets

(51) Int. Cl.
| | | |
|---|---|---|
| *H10D 84/01* | (2025.01) | |
| *H10D 84/03* | (2025.01) | |
| *H10D 84/85* | (2025.01) | |

(52) U.S. Cl.
CPC ....... *H10D 84/0186* (2025.01); *H10D 84/038*
(2025.01); *H10D 84/85* (2025.01)

(56) References Cited

U.S. PATENT DOCUMENTS

| | | |
|---|---|---|
| 2013/0146891 A1 | 6/2013 | Xin et al. |
| 2017/0125574 A1 | 5/2017 | Chowdhury et al. |
| 2021/0050444 A1 | 2/2021 | Matsushima et al. |
| 2024/0072136 A1* | 2/2024 | Lin .................... H10D 30/6729 |
| 2025/0006741 A1* | 1/2025 | Wang .................... H10D 84/85 |

FOREIGN PATENT DOCUMENTS

| | | |
|---|---|---|
| TW | 202243159 A | 11/2022 |
| TW | 202314866 A | 4/2023 |

* cited by examiner

2000

Form first source/drain contact — 2100

Form second source/drain contact — 2200

Form opening in second source/drain contact — 2300

Form seed layer in opening — 2400

Grow conductive through-substrate layer portion on seed layer at offset angle — 2500

Reshape conductive through-substrate layer by annealing — 2600

COMPLEMENTARY FIELD EFFECT TRANSISTOR WITH OBLIQUE CONDUCTIVE THROUGH SUBSTRATE LAYER

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Complementary field effect transistors (CFETs) may be utilized to increase the density of transistors in an integrated circuit. A CFET may include an N-type transistor and a P-type transistor stacked vertically. The gate electrodes of the N-type and P-type transistors may be electrically shorted together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
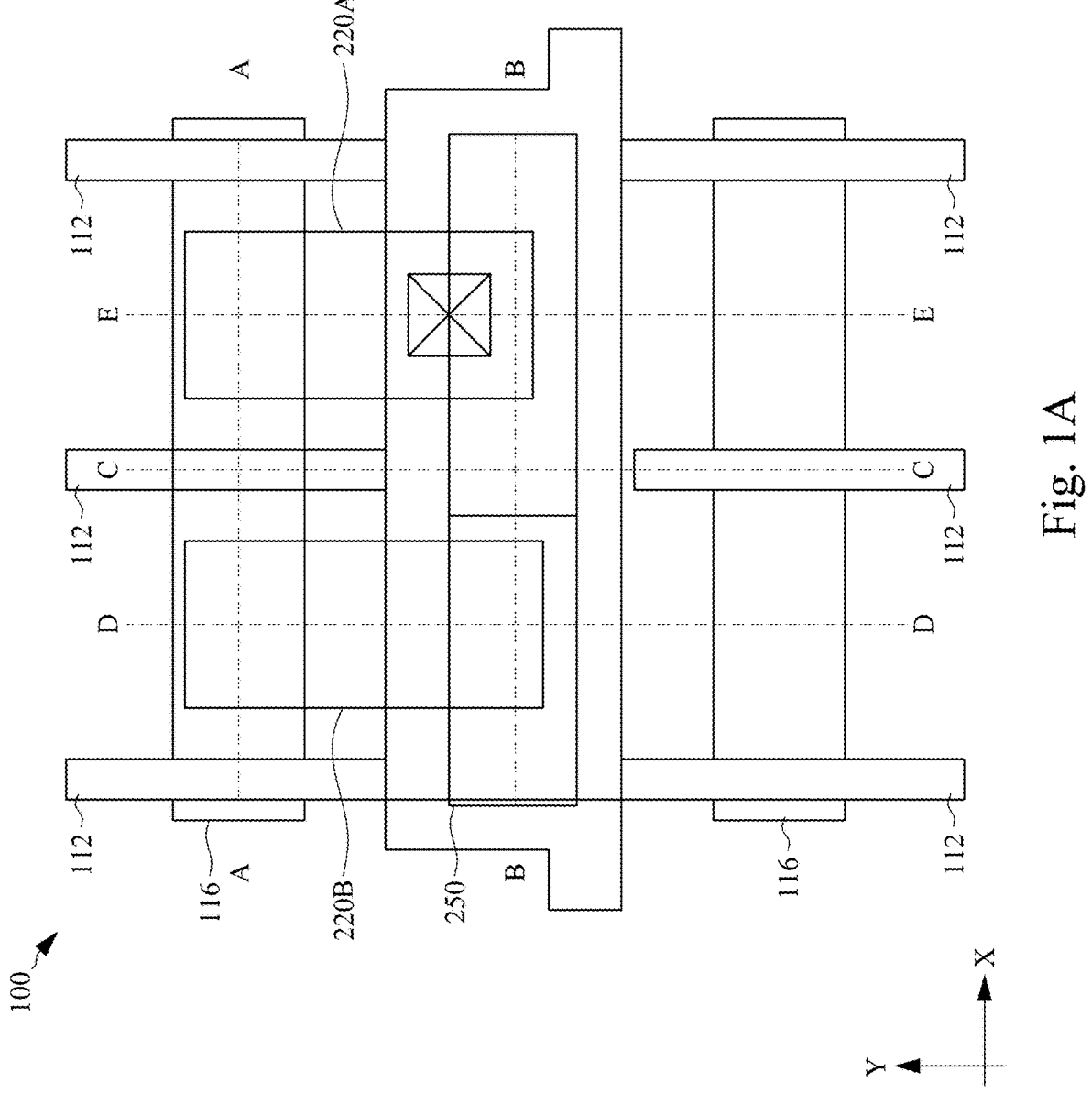
FIGS. 1A-1F are diagrammatic views of an integrated circuit including a CFET, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims, the terms "fill," "fills," "filling" and "filled" include the meaning of partially fill and completely fill (or fills, filling, filled, etc.). For example, a conductive layer may be said to "fill" an opening, which may include that the conductive layer contacts adjacent walls of the opening, or that the conductive layer is present in the opening with one or more different material layers between the conductive layer and the adjacent walls.

As used in this specification and the appended claims, the terms "surround," "surrounds," "surrounding" and "surrounded" include the meaning of completely surround and partially surround (or surrounds, surrounding, surrounded, etc.). For example, a six-sided volume (e.g., a rectangular prism) being "surrounded" includes the meanings of being fully surrounded on all six sides by a material, or may be partially surrounded, such that one or more of the six sides is less than fully covered by the material and has at least a portion thereof exposed.

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor.

Three-dimensional (3D) stacking to form CFETs has been proposed as a potential transistor architecture to further extend Moore's law. Due to the nature of 3D stacking NFETs and PFETs, a vertical local interconnect (VLI, or conductive through-substrate layer "TSL") is advantageous to connect top and bottom devices to each other. However, the large area of the VLI may cause considerable gate-to-source/drain capacitances (Cgs/Cgd) which significantly degrades the performance and/or power of complementary metal-oxide-semiconductor (CMOS) circuits. A first metal layer on top of the VLI may be separated from the VLI by large distances due to potential shorts to the VLI through source/drain contacts and source/drain vias, which wastes limited first metal layer routing resources.

An L-shaped conductive TSL may establish a connection while reducing cross-sectional profile of the conductive TSL. However, formation of an L-shaped profile generally includes at least two etch operations. Time-mode etching (e.g., with no etch stop layer) is also included when performing L-shaped patterning of the conductive TSL.

Embodiments of the disclosure include a conductive TSL that is formed to have oblique orientation by wafer tilt during etching or by directional metal growth. In FinFET and nanosheet structures, P-type source/drains and N-type source/drains may be connected directly by the same source/drain contact, without additional Z-directional penalty. In cFET structures with N/P-type source/drain Z-directional stacking, N/P source/drain interconnection may migrate to three-dimensional (e.g., X-, Y- and Z-directional) interconnects. The conductive TSL of the embodiments may extend from an upper source/drain contact to a lower source/drain contact. The conductive TSL may form a shorter path between the upper and lower source/drain contacts, which is beneficial for reducing resistance of the conductive TSL. The conductive TSL may have reduced cross-sectional profile, which is beneficial for reducing parasitic capacitance between the conductive TSL and neighboring structures, such as source/drain regions, metal gates and the like. In the embodiments, 3D patterning may be achieved directly with a single patterning and etch operation. Directional ALD may also be applied for oblique pillar deposition. The embodiments reduce number of patterning and etch operations, which may reduce cost and simplify process flow.

Figure 1B:
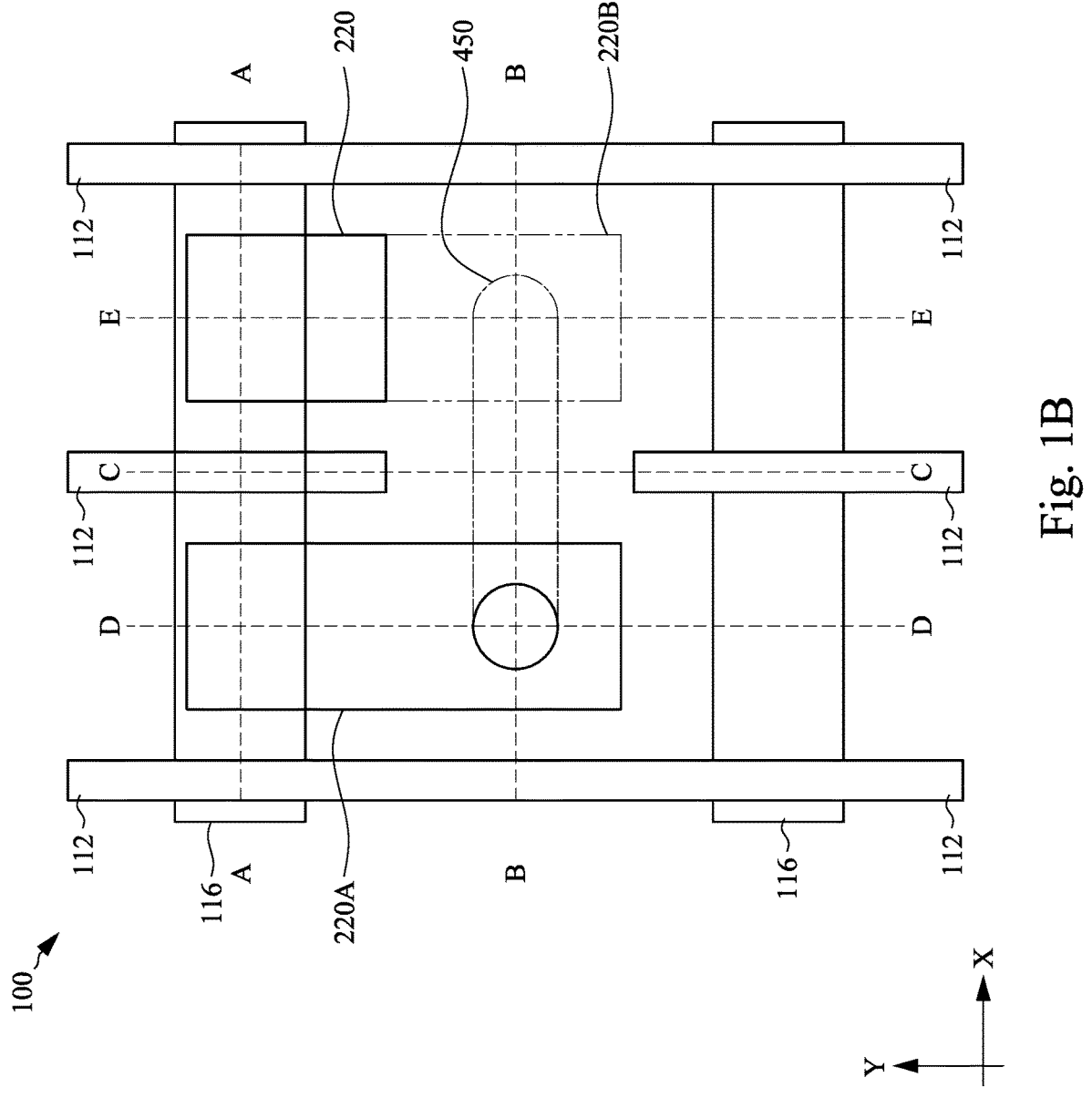
Figure 1C:
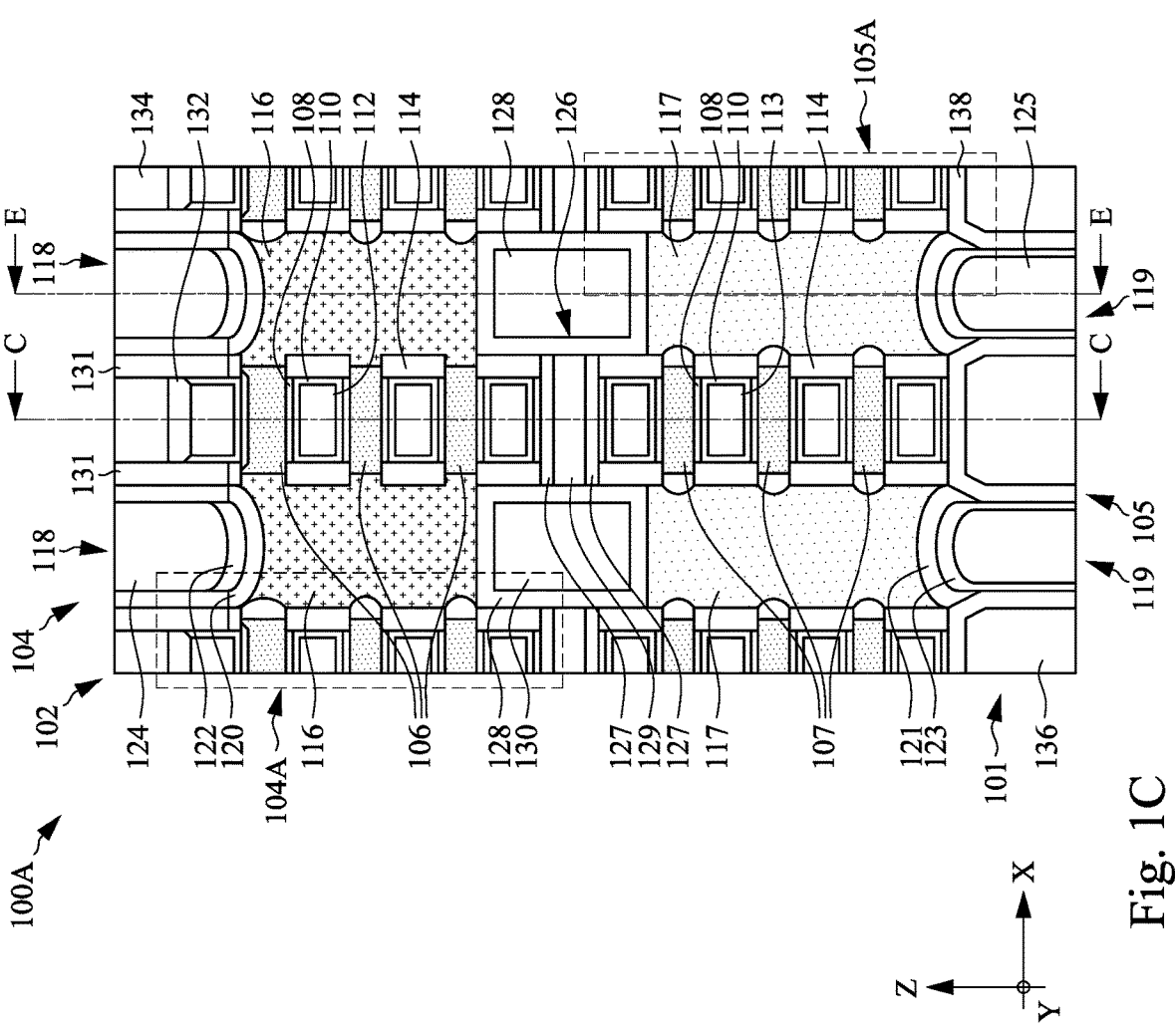

FIGS. 1A and 1B are diagrammatic top views of integrated circuits 100, 100A in accordance with various embodiments. The integrated circuit 100 includes an L-shaped conductive TSL 250 that has a lower portion that is wider than an upper portion thereof. The integrated circuit 100A includes an oblique conductive TSL 450 that extends diagonally from a first source/drain contact 220A to a second source/drain contact 220B on a different level. Some features may be omitted from view in the figures for clarity of illustration. FIG. 1C is a cross-sectional view of integrated circuit 100A (or integrated circuit 100), in accordance with some embodiments. The view of FIG. 1C may correspond to the cross-sectional line A-A in FIGS. 1A and 1B. The view of FIG. 1C is described with reference to the integrated circuit 100A. The same description applies to the integrated circuit 100. The views of FIGS. 1A-1E and FIGS. 2A-2M are described in detail below to provide context for understanding processes described further below with reference to FIGS. 3A-3D, 4A-4D, 5 and 6.

The integrated circuit 100A includes a complimentary field effect transistor (CFET or cFET) 102. The CFET 102 includes a first transistor 104 of a first conductivity type and a second transistor 105 of a second conductivity type. The first transistor 104 is vertically stacked on the second transistor 105. The CFET 102 utilizes an isolation structure 126 to separate the stacked channel regions of the first transistor 104 from the stacked channels of the second transistor 105 in order to improve electrical characteristics of the CFET 102. In other words, a hybrid nanostructure (e.g. hybrid sheet) including the stacked channel region of first transistor 104, isolation structure 126, and the stacked channel region of second transistor 105 is formed.

The CFET transistor 102 may correspond to a gate all around transistor. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around CFET 102 may include a plurality of semiconductor nanostructures corresponding to channel regions of the CFET 102. The semiconductor nanostructures may include nanosheets, nanowires, or other types of nanostructures. The gate all around transistors may also be termed nanostructure transistors.

The view of FIG. 1C is an X-view of the integrated circuit 100A in which the X-axis is the horizontal axis, the Z-axis is the vertical axis, and the Y-axis extends into and out of the drawing sheet. As used herein, the term "X-view" corresponds to a cross-sectional view in which the X-axis is the horizontal dimension and the Z-axis is the vertical dimension. As used herein, the term "Y-view" corresponds to a cross-sectional view in which the Y-axis is the horizontal dimension and the Z-axis is the vertical dimension.

The integrated circuit 100A includes a substrate 101. The substrate 101 can include a semiconductor layer, a dielectric layer, or combinations of semiconductor layers and dielectric layers. Furthermore, conductive structures may be formed within the substrate 101 as backside conductive vias and interconnections, as will be described in more detail below. In some embodiments, the substrate 101 includes a single crystalline semiconductor layer on at least a surface portion. The substrate 101 may include a single crystalline semiconductor material such as, but not limited to Si, Ge, SiGe, GaAs, InSb, GaP, GaSb, InAlAs, InGaAs, GaSbP, GaAsSb and InP.

In some embodiments, the substrate 101 may include dielectric layers including one or more of can include silicon oxide, silicon nitride, silicon oxynitride, silicon carbonitride, silicon oxycarbonitride, fluorine-doped silicate glass (FSG), a low-K dielectric material or other dielectric materials. In some embodiments, the substrate 101 may include shallow trench isolation regions formed in a semiconductor layer. Various configurations of a substrate 101 can be utilized without departing from the scope of the present disclosure. In some embodiments, the substrate 101 is not present, for example, when removed prior to forming a backside interconnect structure.

The transistor 105 is formed above the substrate 101. The transistor 104 is formed above the transistor 105. In some embodiments, the transistor 104 is an N-type transistor and the transistor 105 is a P-type transistor. However, in some embodiments, the transistor 104 may be a P-type transistor and the transistor 105 may be an N-type transistor.

The transistor 104 includes a plurality of semiconductor nanostructures 106. The semiconductor nanostructures 106 are stacked in the vertical direction or Z-direction. In the example of FIG. 1C, there are three stacked semiconductor nanostructures 106. However, in practice, there may be only two stacked nanostructures 106 or there may be more than three stacked semiconductor nanostructures 106 without departing from the scope of the present disclosure. Furthermore, in some embodiments there may be only a single semiconductor nanostructure 106 and a single semiconductor nanostructure 107. The semiconductor nanostructures 106 correspond to channel regions of the transistor 102. The semiconductor nanostructures 106 may be nanosheets, nanowires, or other types of nanostructures.

The transistor 105 includes a plurality of semiconductor nanostructures 107. The semiconductor nanostructures 107 are stacked in the vertical direction or Z-direction. In the example of FIG. 1C, there are three stacked semiconductor nanostructures 107. However, in practice, there may be only two stacked nanostructures 107 or there may be more than three stacked nanostructures 107 without departing from the scope of the present disclosure. The semiconductor nanostructures 107 correspond to channel regions of the transistor 102. The semiconductor nanostructures 107 may be nanosheets, nanowires, or other types of nanostructures. The number of semiconductor nanostructures 107 may be the same as the number of semiconductor nanostructures 106 or may be different than the number of semiconductor nanostructures 106.

The semiconductor nanostructures 106 and 107 may include Si, SiGe, or other semiconductor materials. In a non-limiting example described herein, the semiconductor nanostructures 106 are silicon. The vertical thickness of the semiconductor nanostructures 106 can be between 2 nm and 5 nm. The semiconductor nanostructures 106 may be separated from each other in the vertical direction by 4 nm to 10 nm. Other thicknesses and materials can be utilized for the semiconductor nanostructures 106 without departing from the scope of the present disclosure. The semiconductor nanostructures 107 may have a same material and dimensions as the semiconductor nanostructures 106 or a different semiconductor material from the semiconductor nanostructures 106.

The transistors 104 and 105 include a gate dielectric. The gate dielectric includes an interfacial gate dielectric layer 108 and a high-K gate dielectric layer 110. The interfacial gate dielectric layer 108 is a low-K gate dielectric layer. The interfacial gate dielectric layer 108 is in contact with the semiconductor nanostructures 106 and 107. The high-K gate dielectric layer 110 is in contact with the low-K gate dielectric layer. The interfacial gate dielectric layer 108 is positioned between the semiconductor nanostructures 106 and the high-K gate dielectric layer 110 and between the semiconductor nanostructures 107 and the high-K gate dielectric layer 110.

The interfacial gate dielectric layer 108 can include a dielectric material such as silicon oxide, silicon nitride, or other suitable dielectric materials. The interfacial gate dielectric layer 108 can include a comparatively low-K dielectric with respect to high-K dielectric such as hafnium oxide or other high-K dielectric materials that may be used in gate dielectrics of transistors. The interfacial gate dielectric layer 108 can include a native oxide layer that grows on surfaces of the semiconductor nanostructures 106 and 107. The interfacial gate dielectric layer 108 may have a thickness between 0.4 nm and 2 nm. Other materials, configurations, and thicknesses can be utilized for the interfacial gate dielectric layer 108 without departing from the scope of the present disclosure.

The high-K gate dielectric layer includes one or more layers of a dielectric material, such as HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-k dielectric materials, and/or combinations thereof. The thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

The transistor 104 includes a gate metal 112. The gate metal 112 surrounds the semiconductor nanostructures 106. The gate metal 112 is in contact with the high-K gate dielectric layer 110. The gate metal 112 corresponds to a gate electrode of the transistor 104. In an example in which the transistor 104 is an N-type transistor, the gate metal 112 can include a material that results in a desired work function with the semiconductor nanostructures 106. In one example, the gate metal 112 includes titanium aluminum, titanium, aluminum, tungsten, ruthenium, molybdenum, copper, gold, or other conductive materials. In some embodiments, the gate metal 112 surrounds the semiconductor nanostructures 106 on four sides, e.g., top, bottom, left and right sides. In some embodiments, such as in a forksheet transistor, the gate metal 112 may surround the semiconductor nanostructures 106 on three sides, with the gate metal 112 being substantially not present on the fourth side. For example, the gate metal 112 may be present on outer edges of the fourth side, and may occupy less than about 5% of area of the fourth side.

FIG. 1C illustrates a single gate metal 112. However, in practice, the gate electrode from the transistor 104 can include multiple metal layers. For example, the gate metal 112 can include one or more liner layers or adhesive layers such as tantalum, tantalum nitride, titanium nitride, or other materials. The gate metal 112 can include a gate fill material that fills the remaining volume between the semiconductor nanostructures 106 after the one or more liner layers have been deposited. Various materials, combinations of materials, and configurations may be utilized for the gate metal 112 without departing from the scope of the present disclosure.

The transistor 105 includes a gate metal 113. The gate metal 113 surrounds the semiconductor nanostructures 107. The gate metal 113 is in contact with the high-K gate dielectric layer 110. The gate metal 113 corresponds to a gate electrode of the transistor 105. In an example in which the transistor 105 is a P-type transistor, the gate metal 113 can include a material that results in a desired work function with the semiconductor nanostructures 107. In one example, the gate metal 113 includes titanium nitride, titanium, aluminum, tungsten, ruthenium, molybdenum, copper, gold, or other conductive materials.

FIG. 1C illustrates a single gate metal 113. However, in practice, the gate electrode from the transistor 105 can include multiple metal layers that wrap around the semiconductor nanostructures 107. For example, the gate metal 112 can include one or more liner layers or adhesive layers such as tantalum, tantalum nitride, titanium nitride, or other materials. The gate metal 113 can include a gate fill material that fills the remaining volume between the semiconductor nanostructures 107 after the one or more liner layers have been deposited. Various materials, combinations of materials, and configurations may be utilized for the gate metal 113 without departing from the scope of the present disclosure.

The transistor 104 includes source/drain regions 116. The source/drain regions 116 are in contact with each of the semiconductor nanostructures 106. Each semiconductor nanostructure 106 extends in the X-direction between the source/drain regions 116. The source/drain regions 116 include a semiconductor material. The transistor 105 includes source/drain regions 117. The source/drain regions 117 are in contact with each of the semiconductor nanostructures 107. Each semiconductor nanostructure 107 extends in the X-direction between the source/drain regions 117. The source/drain regions 117 include a semiconductor material.

In an example in which the transistor 104 is an N-type transistor and the transistor 105 is a P-type transistor, the source/drain regions 116 can be doped with N-type dopant species. The N-type dopant species can include P, As, or other N-type dopant species. The source/drain regions 117 can be doped with P-type dopant species in the case of a P-type transistor. The P-type dopant species can include B or other P-type dopant species. The doping can be performed in-situ during an epitaxial growth process of the source/drain regions 117. The source/drain regions 116 and 117 can include other materials and structures without departing from the scope of the present disclosure.

As used herein, the term "source/drain region" may refer to a source region or a drain region individually or collectively dependent upon the context. Accordingly, one of the source/drain regions 116 may be a source region while the other source/drain region 116 is a drain region, or vice versa. Furthermore, in some cases, one or both of the source/drain regions 116 may be shared with one or more laterally adjacent transistors.

The transistors 104 and 105 each include inner spacers 114. The inner spacers 114 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In one example, the inner spacers 114 include silicon oxycarbonitride.

The inner spacers 114 of the transistor 104 physically separate the gate metal 112 from the source/drain regions 116. This prevents short circuits between the gate metal 112 and the source/drain regions 116. The inner spacers 114 of the transistor 105 physically separate the gate metal 113 from the source/drain regions 117. This prevents short circuits between the gate metal 113 and the source/drain regions 117.

The transistor 104 may include source/drain contacts 118. Each source/drain contact 118 is positioned over and is electrically connected to a respective source/drain region 116. Electrical signals may be applied to the source/drain regions 116 via the source/drain contacts 118. The source/drain contacts 118 may include silicide 120. The silicide 120 is formed at the top of the source/drain regions 116. The silicide 120 can include titanium silicide, aluminum silicide, nickel silicide, tungsten silicide, or other suitable silicides.

The source/drain contacts 118 may also include a conductive layer 122 positioned on the silicide 120. The conductive layer 122 can include titanium nitride, tantalum nitride, titanium, tantalum, or other suitable conductive materials. The source/drain contacts 118 may also include a conductive layer 124 on the conductive layer 122. The conductive layer 124 can include a conductive material such as tungsten, cobalt, ruthenium, titanium, aluminum, tantalum, or other suitable conductive materials. Other materials and configurations can be utilized for the source/drain contacts 118 without departing from the scope of the present disclosure.

The transistor 105 may include source/drain contacts 119. Each source/drain contact 119 is positioned below and is electrically connected to a respective source/drain region 117. Electrical signals may be applied to the source/drain regions 117 via the source/drain contacts 119. The source/drain contacts 119 may include silicide 121. The silicide 121 is formed at the bottom of the source/drain regions 117. The silicide 121 can include titanium silicide, aluminum silicide, nickel silicide, tungsten silicide, or other suitable silicides.

The source/drain contacts 119 may also include a conductive layer 123 positioned on the silicide 121. The conductive layer 123 can include titanium nitride, tantalum nitride, titanium, tantalum, or other suitable conductive materials. The source/drain region 119 may also include a conductive layer 125 on the conductive layer 123. The conductive layer 125 can include a conductive material such as tungsten, cobalt, ruthenium, titanium, aluminum, tantalum, or other suitable conductive materials. Other materials and configurations can be utilized for the source/drain contacts 119 without departing from the scope of the present disclosure.

The transistor 102 includes sidewall spacers 131. The sidewall spacers 131 are positioned adjacent to the uppermost portion of the gate metal 112 and electrically isolate the gate metal 112 from the source/drain contacts 118. The sidewall spacers 131 may include one or more of silicon oxide, silicon nitride, silicon oxynitride, silicon carbonitride, silicon oxycarbonitride, fluorine-doped silicate glass (FSG), a low-K dielectric material or other dielectric materials. Other thicknesses and materials can be utilized for the sidewall spacers 131 without departing from the scope of the present disclosure.

The transistor 102 may include a gate cap metal 132 positioned on an uppermost portion of the gate metal 112. In some embodiments, the gate cap metal 132 includes tungsten, fluorine free tungsten, or other suitable conductive materials. The gate cap metal 132 may have a height between 1 nm and 10 nm. Other configurations, materials, and thicknesses can be utilized for the gate cap metal 132 without departing from the scope of the present disclosure.

The substrate 101 may include a dielectric layer 136 and a dielectric layer 138. The dielectric layer 138 may be positioned in contact with sidewalls of the source/drain contacts 119 and a lowermost portion interfacial gate dielectric layer 108 of the transistor 105. The dielectric layer 138 may include silicon oxide, silicon nitride, silicon oxynitride, silicon carbonitride, silicon oxycarbonitride, fluorine-doped silicate glass (FSG), a low-K dielectric material or other dielectric materials. The dielectric layer 136 is positioned in contact with the dielectric layer 138. The dielectric layer 136 may include silicon oxide, silicon nitride, silicon oxynitride, silicon carbonitride, silicon oxycarbonitride, fluorine-doped silicate glass (FSG), a low-K dielectric material or other dielectric materials.

The CFET 102 can be operated by applying voltages to the source/drain regions 116/117 and the gate metals 112/113. The voltages can be applied to the source/drain regions 116/117 via the source/drain contacts 118/119. The voltages can be applied to the gate metals 112/113 via a gate contact not shown in FIG. 1C. Though not apparent in the view of FIG. 1C, the gate metal 112 and the gate metal 113 are shorted together. Accordingly, the gate metal 112 and the gate metal 113 jointly correspond to the gate electrode of the CFET 102. The voltage applied to the gate metals 112/113 may turn on the transistor 104 and turn off the transistor 105 or may turn on the transistor 105 and turn off the transistor 104. While the gate metals 112/113 are shorted together, the source/drain regions 116 are not shorted together with the source/drain regions 117. Depending on a particular electrical circuit configuration, the flow of current can be selectively enabled or prohibited through the source/drain regions 116 and 117 individually.

As described previously, it may be beneficial to obtain desired work functions for the transistors 104 and 105 by utilizing different materials for the gate metals 112 and 113. One possible way of forming the gate metals 112/113 is to first deposit the gate metal 113 around all of the semiconductor nanostructures 106 and 107 and then to perform a timed etch to remove the gate metal 113 from around the semiconductor nanostructures 106. This is followed by depositing the gate metal 112 around the semiconductor nanostructures 106 after the timed etch of the gate metal 113. However, one drawback of this process is that in some cases the gate metal 113 may not be entirely removed directly below the lowest semiconductor nanostructure 106. This can interfere with the work function of the transistor 104, thereby affecting the threshold voltage of the transistor 104 in an undesired manner.

The CFET 102 avoids or reduces the possibility of work function interference by utilizing an isolation structure 126 between the semiconductor nanostructures 106 and the semiconductor nanostructures 107. More particularly, the isolation structure 126 is positioned directly between the lowest semiconductor nanostructure 106 and the highest semiconductor nanostructure 107. The isolation structure 126 may include upper and lower semiconductor layers 127 and a dielectric layer 129 between the upper and lower semiconductor layers 127. Various structures and compositions can be utilized for the isolation structure 126 without departing from the scope of the present disclosure. In some embodiments, the isolation structure 126 is not included.

The dielectric layer 129 may include silicon oxide, silicon nitride, silicon oxynitride, silicon carbonitride, silicon oxy-carbonitride, fluorine-doped silicate glass (FSG), a low-K dielectric material or other dielectric materials. The dielectric layer 129 may have a length in the X direction between 15 nm and 30 nm. A length in this range may be sufficient to match or exceed the length of the semiconductor nanostructures 106 and 107 in the X direction. However, depending on the length of the semiconductor nanostructures 106 and 107, a greater or lower length of the dielectric layer 129 may be selected. The dielectric layer 129 may have a height in the Z direction between 5 nm and 25 nm. These dimensions may be sufficient to ensure that there is no possibility of work function interference from the gate metal 113 with the semiconductor nanostructures 106. Furthermore, these dimensions may provide reduced gate to drain capacitance. Other materials, dimensions, and configurations can be utilized for the dielectric layer 129 without departing from the scope of the present disclosure. The dielectric layer 129 may be termed a dielectric nanostructure. The dielectric nanostructure can include a dielectric nanosheet, the dielectric nanowires, or another type of dielectric nanostructure.

The dielectric layer 129 has a top surface 135 and a bottom surface 137. The gate metals 112 and 113 meet at an interface 139. In some embodiments, the interface 139 between the gate metals 112 and 113 is lower than a top surface 135 of the dielectric layer 129. In some embodiments, the interface 139 is lower than a top surface 135 and higher than a bottom surface 137 of the dielectric layer 129. This can help to ensure that there is not work function interference of the transistor 102 by the gate metal 113.

Each semiconductor layer 127 may have a vertical thickness between 1 nm and 5 nm. The semiconductor layers 127 may include silicon or another suitable semiconductor material. Other materials and dimensions may be utilized for the semiconductor layers 127 without departing from the scope of the present disclosure.

Although FIG. 1C illustrates a single dielectric layer 129, in practice, the dielectric layer 129 may include multiple layers of different dielectric material between the semiconductor layers 127. For example, a first dielectric layer of silicon oxide may be positioned in contact with each of the semiconductor layers 127. A second dielectric layer of silicon nitride may be positioned between upper and lower portions of the first dielectric layer. Various configurations for a dielectric barrier between the top semiconductor nanostructure 107 and the bottom semiconductor nanostructure 106 may be utilized without departing from the scope of the present disclosure.

In embodiments of the disclosure, a first transistor 105A and a second transistor 104A are electrically connected by an interconnect structure that includes an oblique portion. The first transistor 105A has a first source/drain region 117. The second transistor 104A is above the first transistor 105A in a vertical direction (e.g., the Z-axis direction) and has a second source/drain region 116. The second transistor 104A is offset from the first transistor 105A in a first direction (e.g., the X-axis direction) that is perpendicular to the vertical direction. A first source/drain contact 119 is electrically coupled to the first source/drain region 117. A second source/drain contact 118 is electrically coupled to the second source/drain region 116. An interconnect structure described with reference to FIGS. 3A-3D and FIGS. 4A-4D is electrically coupled to the first source/drain contact 119 and the second source/drain contact 118 and includes an oblique portion that extends from the first source/drain contact 119 to the second source/drain contact 119 at an offset angle from the vertical direction. In some embodiments, the "first transistor" is transistor 104A and the "second transistor" is transistor 105A, the "first source/drain region" is source/drain region 116 and the "second source/drain region" is source/drain region 117, and the "first source/drain contact" is source/drain contact 118 and the "second source/drain contact" is source/drain contact 119.

Figure 1E:
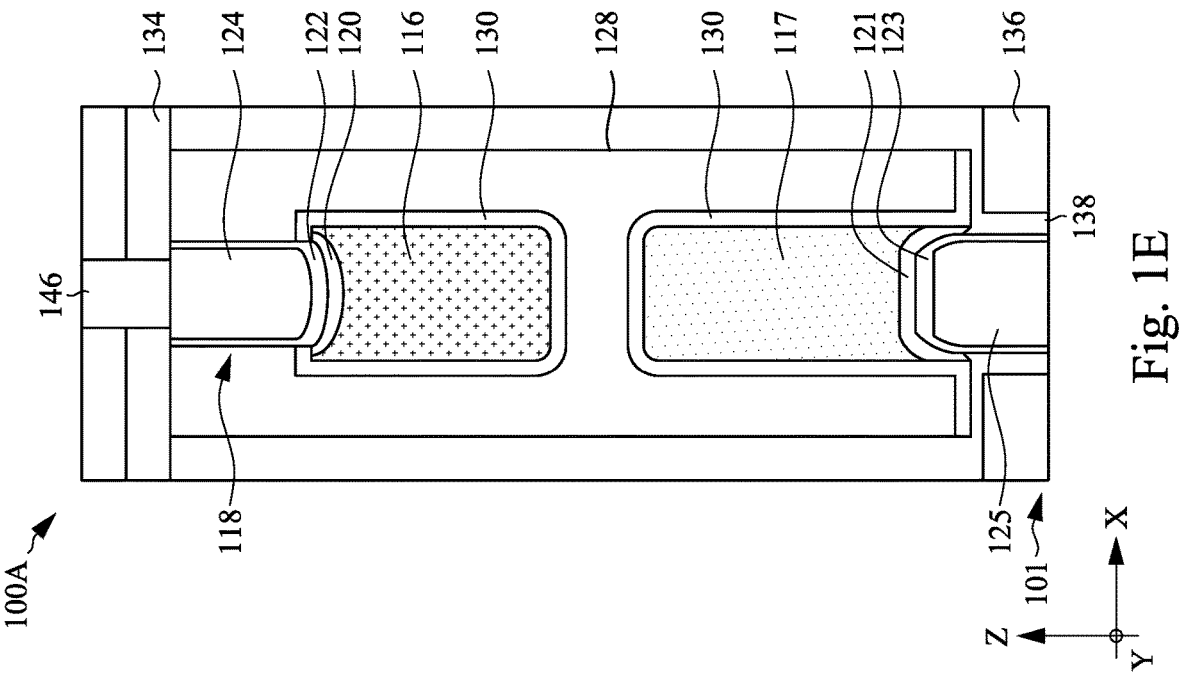
Figure 1D:
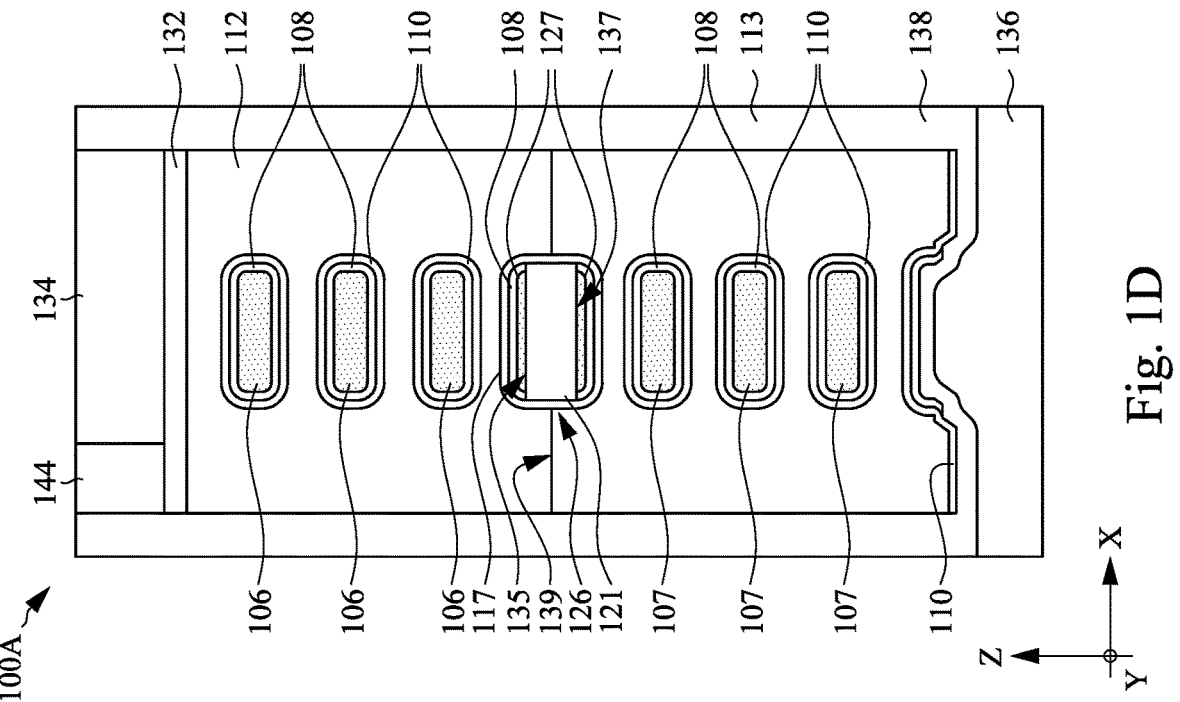

FIG. 1D is a Y-view of the integrated circuit 100A of FIG. 1C taken along cut lines 1B of FIG. 1C. Accordingly, in the view of FIG. 1D, the Y-axis is the horizontal axis, while the X-axis extends into and out of the drawing sheet. The view of FIG. 1D is a wide cut through the gate metals 112 and 113 of the transistors 104 and 105. FIG. 1D illustrates how the gate metal 112 wraps around each of the semiconductor nanostructures 106 of the transistor 104. Correspondingly, the gate metal 113 wraps around each of the semiconductor nanostructures 107 of the transistor 105.

FIG. 1D illustrates a gate contact 144 extends into the dielectric layer 134. The gate contact 144 contacts the gate cap metal 132. Accordingly, the gate contact 144 is electrically connected to the gate metals 112 and 113 of the transistors 104 and 105. The gate contact 144 can include tungsten, titanium, tantalum, aluminum, copper, tantalum nitride, titanium nitride, or other suitable conductive materials. Various configurations and materials can be utilized for the gate contact 144 without departing from the scope of the present disclosure.

FIG. 1D also illustrates the isolation structure 126 positioned between the lowest semiconductor nanostructure 106 and the highest semiconductor nanostructure 107. The isolation structure 126 includes the dielectric layer 129 and the semiconductor layers 127 above and below the dielectric layer 129. FIG. 1D also illustrates that the interfacial gate dielectric layer 108 is present on the outer surfaces of the semiconductor layers 127. The high-K gate dielectric layer 110 surrounds the isolation structure 126 in the Y-Z plane.

In some embodiments, the width of the isolation structure 126 in the Y direction is substantially equal to or slightly greater than the width of the semiconductor nanostructures 106/107 in the Y direction. The isolation structure 126 is thicker than the semiconductor nanostructures 106/107 in the Z direction. Furthermore, the isolation structure 126 is thicker in the Z direction than the portion of the gate metal 113 between the top semiconductor nanostructure 107 and the isolation structure 126. This is because the sacrificial semiconductor layer 154 (see FIG. 2A) is thicker than the sacrificial semiconductor layers 152. The gate metals 112/113 are formed in place of the sacrificial semiconductor nanostructures 152.

In some embodiments, a junction or interface of the gate metals 112/113 occurs at a vertical height corresponding to a vertical midway level of the isolation structure 126. The junction or interface of the gate metals 112/113 may occur at any vertical level between the semiconductor layers 127. Other configurations of the gate metals 112/113 and the isolation structure 126 can be utilized without departing from the scope of the present disclosure.

FIG. 1E is a cross-sectional view of the integrated circuit 100A of FIG. 1C taken along cut lines 1C of FIG. 1C. Accordingly, in the view of FIG. 1E, the Y-axis is the horizontal axis, while the x-axis extends into and out of the drawing sheet. The view of FIG. 1D is a wide cut through the source/drain regions 116 and 117 from one side of the CFET 102.

FIG. 1E illustrates that the dielectric layer 130 surrounds the source/drain regions 116 and 117 in the Y-Z plane, aside from where the source/drain contacts 118/119 are connected to the source/drain regions 116/117. FIG. 1E also illustrates the interlevel dielectric layer 128 surrounds the outer surfaces of the dielectric layer 130 and fills the space between the source/drain region 116 and the source/drain region 117. FIG. 1E also illustrates a conductive via 146 electrically connected to the source/drain contact 118 of the transistor 104. The conductive via 146 may include tungsten, titanium, aluminum, copper, titanium nitride, tantalum nitride, or other suitable conductive layers. Though not shown in FIG. 1E, a conductive via may also extend through the substrate 101 to contact the bottom of the source/drain contact 119 in order to provide electrical connection to the source/drain regions 117.

Figure 1F:
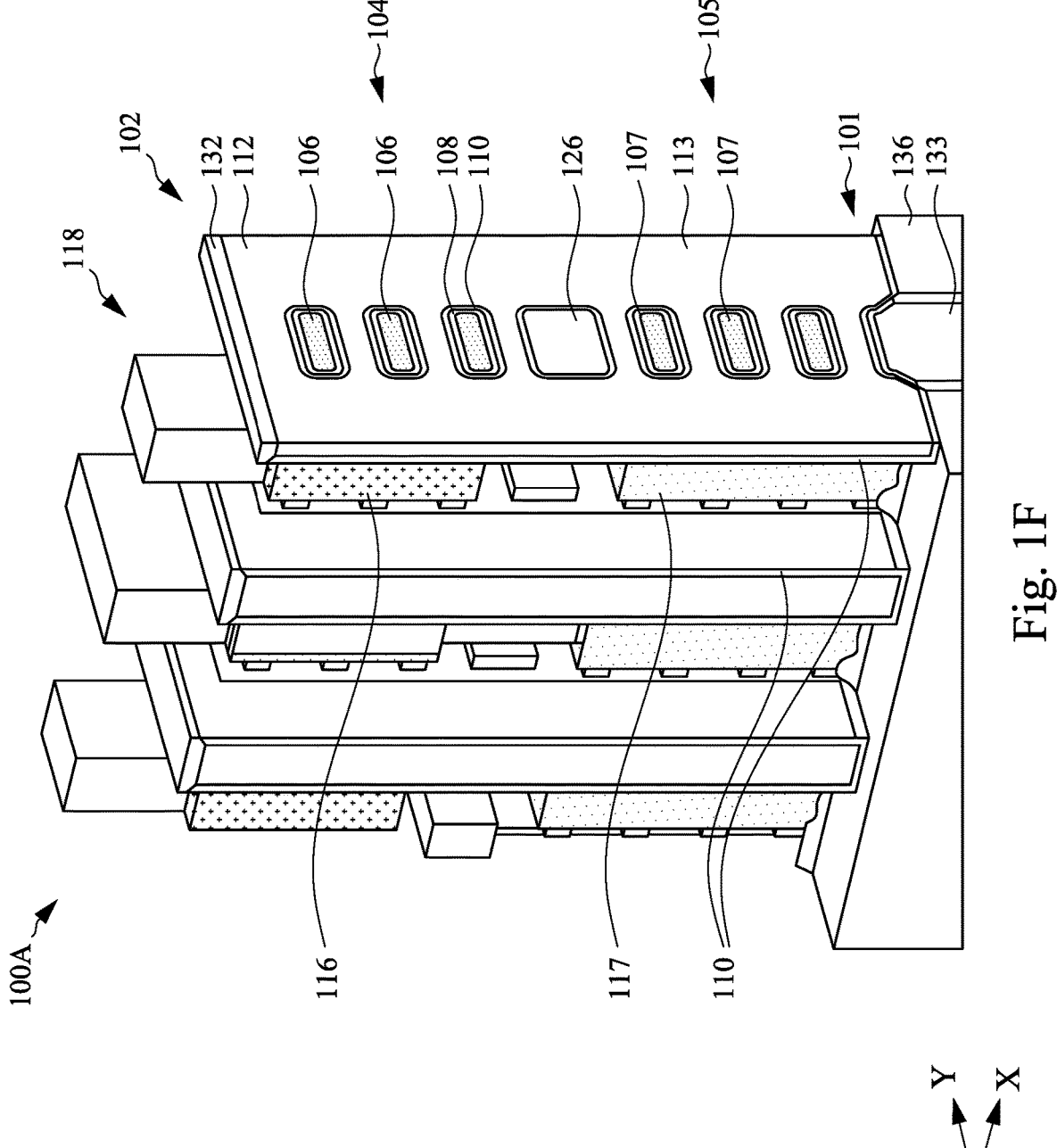

FIG. 1F is a perspective view of the integrated circuit 100A of FIG. 1C, in accordance with some embodiments. FIG. 1F does not illustrate the interlevel dielectric layer 128 or the dielectric layer 130 so that the position of the source/drain regions 116 and 117 is apparent. FIG. 1F illustrates the semiconductor nanostructures 106 and 107, the interfacial gate dielectric layer 108 and the high-K gate dielectric layer 110 surrounding the semiconductor nanostructures 106 and 107, the gate metal 112 surrounding the semiconductor nanostructures 106, and the gate metal 113 surrounding the semiconductor nanostructures 107. The isolation structure 126 is present between the lowest semiconductor nanostructure 106 and the highest semiconductor nanostructure 107. The gate cap metal 132 is visible on top of the gate metal 112. The source/drain contact 118 is coupled to the source/drain region 116. FIG. 1F also illustrates that the high-K dielectric layer 110 is also present on sidewalls of the gate metals 112 and 113 and that the bottom of the gate metal 113. The substrate 101, may also include a semiconductor layer 133, although at this point in processing the semiconductor layer 133 may also be entirely removed after forming backside conductive structures. Various other configurations of the integrated circuit 100A can be utilized without departing from the scope of the present disclosure.

FIGS. 2A-2M are cross-sectional views of an integrated circuit 100A at various stages of processing, in accordance with some embodiments. FIGS. 2A-2M illustrate a process for forming a CFET 102, in accordance with some embodiments.

Figure 2B:
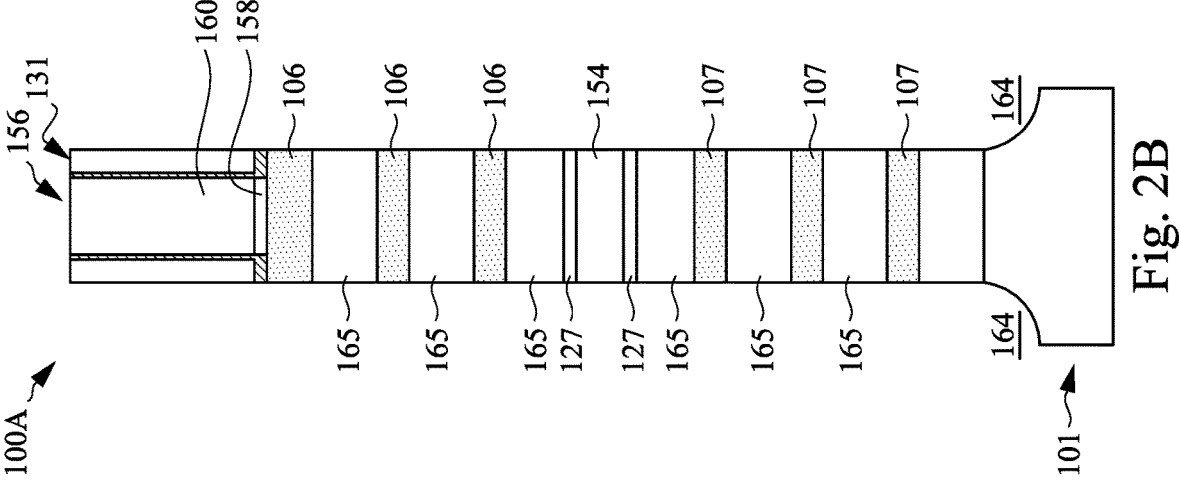
FIGS. 2A-2M are diagrammatic cross-sectional views of an integrated circuit at various stages of processing, in accordance with some embodiments.
Figure 2A:
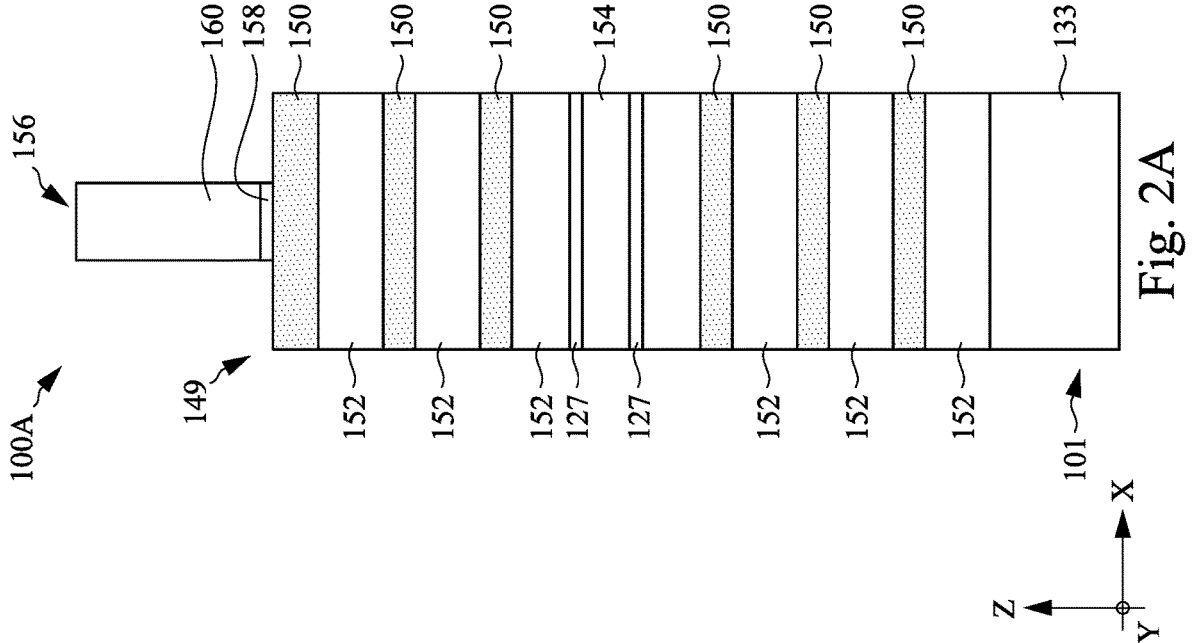

FIG. 2A is a cross-sectional X-view of an integrated circuit 100A, in accordance with some embodiments. In FIG. 2A, a semiconductor fin 149 includes a plurality of semiconductor layers 150, a plurality of sacrificial semiconductor layers 152 stacked on the substrate 101, semiconductor layers 127, and a special sacrificial semiconductor layer 154. The sacrificial semiconductor layers 152 are positioned between the semiconductor layers 150. As will be described in more detail below, the semiconductor layers 150 will eventually be patterned to form the semiconductor nanostructures 106/107 that corresponds to the channel regions of the complementary transistors 104/105 that collectively make up the CFET 102. Accordingly, the semiconductor layers 150 can have materials and vertical thicknesses described in relation to the semiconductor nanostructures 106/107 of FIGS. 1A and 1B. The semiconductor fin 149 may be termed a hybrid nanostructure or may be patterned to form a hybrid nanostructure as will be described in more detail below.

The sacrificial semiconductor layers 152 includes a semiconductor material different than the semiconductor material of the semiconductor layers 150. In particular, the sacrificial semiconductor layers 152 include materials that are selectively etchable with respect to the material of the semiconductor layers 150. As will be described in further detail below, the sacrificial semiconductor layers 152 will eventually be patterned to form sacrificial semiconductor nanostructures. The sacrificial semiconductor nanostructures will eventually be replaced by gate metals positioned between the semiconductor nanostructures 106. In one example, the sacrificial semiconductor layers 152 can include a single crystalline semiconductor material such as, but not limited to Si, Ge, SiGe, GaAs, InSb, GaP, GaSb, InAlAs, InGaAs, GaSbP, GaAsSb and InP. In an example process described herein, the sacrificial semiconductor layers 152 include SiGe, while the semiconductor layers 150 include Si. Other materials and configurations can be utilized for the sacrificial semiconductor layers 152 and the semiconductor layers 150 without departing from the scope of the present disclosure.

In some embodiments, each semiconductor layer 150 includes intrinsic silicon and each sacrificial semiconductor layer 152 includes silicon germanium. The sacrificial semiconductor layers 152 may have a relatively low germanium concentration of between 10% and 35%. A concentration in this range can provide sacrificial semiconductor layers 152 that are selectively etchable with respect to the semiconductor layers 150. In some embodiments, the semiconductor layers 150 have a thickness between 2 nm and 5 nm. In some embodiments, the sacrificial semiconductor layers 152 have a thickness between 4 nm and 10 nm. Other materials, concentrations, and thicknesses can be utilized for the semiconductor layers 150 and the sacrificial semiconductor layers 152 without departing from the scope of the present disclosure.

In some embodiments, the semiconductor fin 149 is formed by performing a series of epitaxial growth processes. A first epitaxial growth process grows the lowest sacrificial semiconductor layer 152 on the semiconductor substrate 133. A second epitaxial growth process grows the lowest semiconductor layer 150 on the lowest sacrificial semiconductor layer 152. Alternating epitaxial growth processes are performed to form the four lowest sacrificial semiconductor layers 152 and the three lowest semiconductor layers 150. Depending on the number of semiconductor nanostructures desired for the lower transistor 105 of the CFET 102, more or fewer sacrificial semiconductor layers 152 and semiconductor layers 150 can be formed.

After the semiconductor layers 150 and sacrificial semiconductor layers 152 associated with the lower transistor 105 have been formed, layers associated with the isolation structure 126 will be formed. In particular, an epitaxial growth process is performed to form the lower semiconductor layer 127. In one example, the lower semiconductor layer 127 is intrinsic silicon having a thickness between 1 nm and 3 nm. After the lower semiconductor layer 127 is formed, another epitaxial growth process is performed to form a special sacrificial semiconductor layer 154. The sacrificial semiconductor layer 154 has a composition that is selectively etchable with respect to the semiconductor layers 150 and the sacrificial semiconductor layers 152. In an example in which the sacrificial semiconductor layers 152 are silicon germanium with a relatively low concentration of germanium, the sacrificial semiconductor layer 154 can include silicon germanium with a relatively high concentration of germanium. In some embodiments, the concentration of germanium in the sacrificial semiconductor layer 154 is greater than 50%.

In some embodiments, the concentration of germanium in the sacrificial semiconductor layer 154 is at least an additional 25% above the concentration of germanium in the sacrificial semiconductor layers 152. For example, if the sacrificial semiconductor layers 152 have a germanium concentration of 35%, then the sacrificial semiconductor layer 154 will have a germanium concentration greater than or equal to 60%. In some embodiments, the concentration of germanium in the sacrificial semiconductor layer 154 is greater than the concentration of germanium in the sacrificial semiconductor layers 152 by a factor of 2-5. In some embodiments, the germanium concentration of the sacrificial semiconductor layer 154 is less than or equal to 80%. The sacrificial semiconductor layers 154 may have a thickness between 5 nm and 25 nm and a length between 15 nm and 30 nm. The thickness of the sacrificial semiconductor layer 154 is greater than the thickness of the sacrificial semiconductor layers 152. The thickness of the sacrificial semiconductor layers 152 is greater than the thickness of the semiconductor layer 150. Other compositions, materials, and thicknesses can be utilized for the sacrificial semiconductor layer 154 without departing from the scope of the present disclosure.

After formation of the sacrificial semiconductor layer 154, an epitaxial growth process is performed to form the upper semiconductor layer 127 on the sacrificial semiconductor layer 154. The upper semiconductor layer 127 may have a composition thickness substantially identical to the composition in thickness of the lower semiconductor layer 127.

After formation of the sacrificial semiconductor layer 154 and the upper semiconductor layer 127, the upper sacrificial semiconductor layers 152 and semiconductor layers 150 associated with the upper transistor 104 are formed. The upper sacrificial semiconductor layers 152 and semiconductor layers 150 can be formed with alternating epitaxial growth processes as described in relation to the lower semiconductor layers 150 and sacrificial semiconductor layers 152.

A dummy gate structure 156 has been formed on top of the highest semiconductor layer 150. The dummy gate structure 156 may correspond to a fin extending in the Y direction. The dummy gate structure 156 is referred to as a dummy gate structure or "sacrificial gate structure" because the gate electrodes of the transistor 102 will be formed, in part, in place of the dummy gate structure 156.

The dummy gate structure 156 includes a dielectric layer 158. The dielectric layer 158 can include a thin layer of silicon oxide grown on the top semiconductor layer 150 via chemical vapor deposition (CVD), physical vapor deposition (PVD), or atomic layer deposition (ALD). The dielectric layer 158 may have a thickness between 0.2 nm and 2 nm. Other thicknesses materials, and deposition processes can be utilized for the dielectric layer 158 without departing from the scope of the present disclosure.

The dummy gate structure 156 includes a layer of polysilicon 160. The layer of polysilicon 160 can have a thickness between 20 nm and 100 nm. The layer of polysilicon 160 can be deposited by an epitaxial growth, a CVD process, a physical vapor deposition (PVD) process, or an ALD process. Other thicknesses and deposition processes can be used for depositing the layer of polysilicon 160 without departing from the scope of the present disclosure.

The dummy gate structure 156 may also include one or more additional dielectric layers above the layer of polysilicon 160. Various configurations and materials can be utilized for the dummy gate structure 156 without departing from the scope of the present disclosure.

FIG. 2B is an X-view of the integrated circuit 100A, in accordance with some embodiments. In FIG. 2B, a sidewall spacer 131 has been formed on sidewalls of the dummy gate structure 156. The sidewall spacer 131 may include multiple dielectric layers. Each of the dielectric layers of the sidewall spacer 131 may include silicon oxide, silicon nitride, silicon oxynitride, silicon carbonitride, silicon oxycarbonitride, fluorine-doped silicate glass (FSG), a low-K dielectric material or other dielectric materials. The dielectric layers of the sidewall spacer 131 can be deposited by CVD, PVD, ALD, or other suitable processes.

Figure 2D:
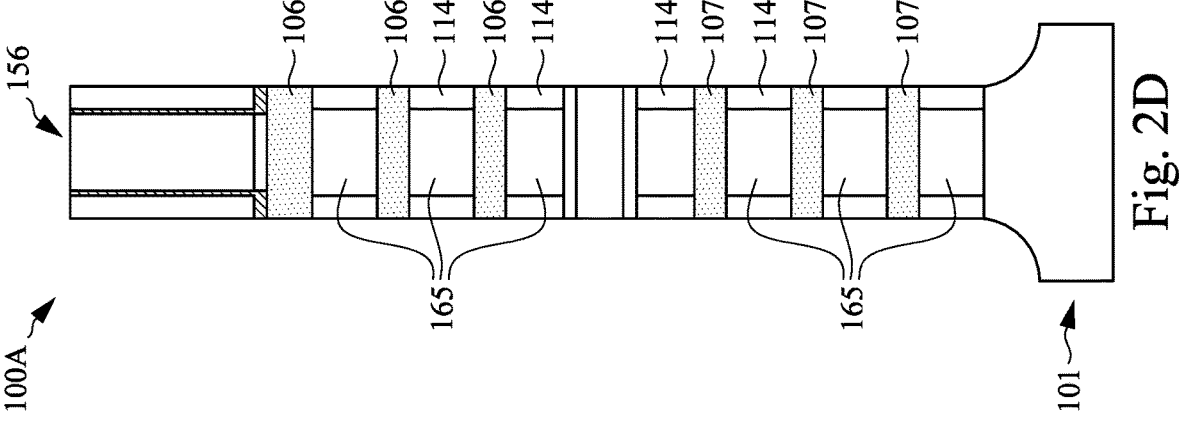
Figure 2C:
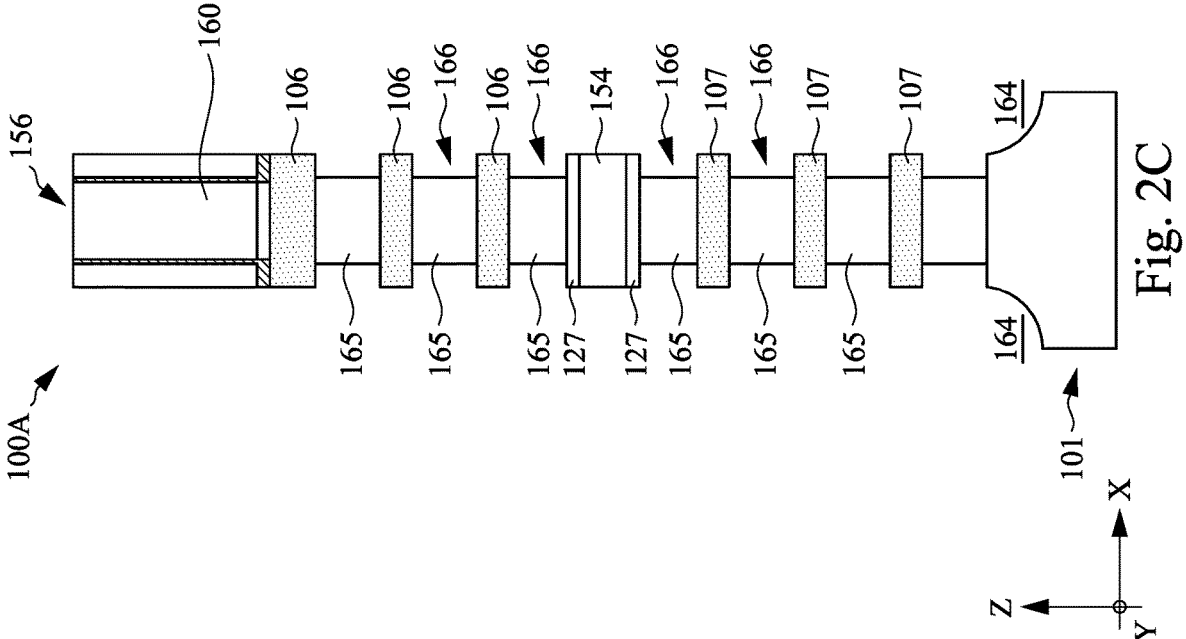

FIG. 2C is an X-view of the integrated circuit 100A, in accordance with some embodiments. In FIG. 2C, source/drain trenches 164 have been formed through the semiconductor fins 149. The source/drain trenches 164 correspond to locations at which source/drain regions 116 and 117 will be formed. The etching process to form source/drain trenches 164 etches the semiconductor layers 150, the sacrificial semiconductor layers 152, the semiconductor layers 127, and the sacrificial semiconductor layer 154 to form semiconductor nanostructures 106 and 107 from the semiconductor layers 150. More particularly, the etching process forms stacks of semiconductor nanostructures 106 and 107. The semiconductor nanostructures 106 correspond to the channel regions of the transistor 104. The semiconductor nanostructures 107 correspond to the channel regions of the transistor 105. The etching process also forms sacrificial semiconductor nanostructures 165 from the sacrificial semiconductor layers 152. The sacrificial semiconductor nanostructures 165 are positioned between the semiconductor nanostructures 106 and between the semiconductor nanostructures 107. The source/drain trenches 164 extend into the semiconductor substrate 133.

The etching process can include one or more anisotropic etching processes that selectively etch the materials of the semiconductor layers 150 and sacrificial semiconductor layers 152 in the vertical direction. The etching process may include a single step or multiple steps. The etching process may include one or more timed etches. Other types of etching processes can be utilized without departing from the scope of the present disclosure.

In FIG. 2C, a recess step has been performed to recess the sacrificial semiconductor nanostructures 165. The recessing process removes outer portions of the sacrificial semiconductor nanostructures 165 without entirely removing the sacrificial semiconductor nanostructures 165. The recessing process can be performed with an isotropic etch that selectively etches the material of the sacrificial semiconductor nanostructures 165 with respect to the materials of the semiconductor nanostructures 106/107, the sacrificial semiconductor layer 154, and the substrate 101. The isotropic etching process can include a timed etching process. The duration of the etching process is selected to remove only a portion of the sacrificial semiconductor nanostructures 165 without entirely removing the sacrificial semiconductor nanostructures 165. The result of the etching process is that recesses 166 are formed in the sacrificial semiconductor nanostructures 165.

The etching process can include a dry etch with a gas that is a mixture of SF6, H2, and CF4. The etching process may etch the sacrificial semiconductor nanostructures 165 at a rate that is greater than 10 times the rate at which the sacrificial semiconductor layer 154 is etched. Other etchants and etching processes can be utilized without departing from the scope of the present disclosure.

FIG. 2D is an X view of the integrated circuit 100A, in accordance with some embodiments. In FIG. 2D, inner spacers 114 have been formed in the recesses 166. The inner spacers 114 can be formed by depositing a dielectric layer on the exposed sidewalls of the semiconductor nanostructures 106/107, on the bottom of the source/drain trenches 164, and in the recesses 166 formed in the sacrificial semiconductor nanostructures 165. The dielectric layer can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer can be formed by CVD, PVD, ALD, or via another process. The lateral thickness of the dielectric layer may be between 2 nm and 10 nm. Other thicknesses, materials, and deposition processes can be utilized for the dielectric layer without departing from the scope of the present disclosure.

An etching process is then performed to remove excess portions of the dielectric layer. The etching process can include an isotropic etching process that etches in all directions. The isotropic etching process is timed so that the dielectric layer is removed at all locations except the locations of increased lateral thickness resulting from the recesses 166 in the sacrificial semiconductor nanostructures 165. The result is that the inner spacers 114 remain at the recesses 166 in the sacrificial semiconductor nanostructures 165. Other processes can be utilized to form the inner spacers 114 without departing from the scope of the present disclosure.

Figure 2F:
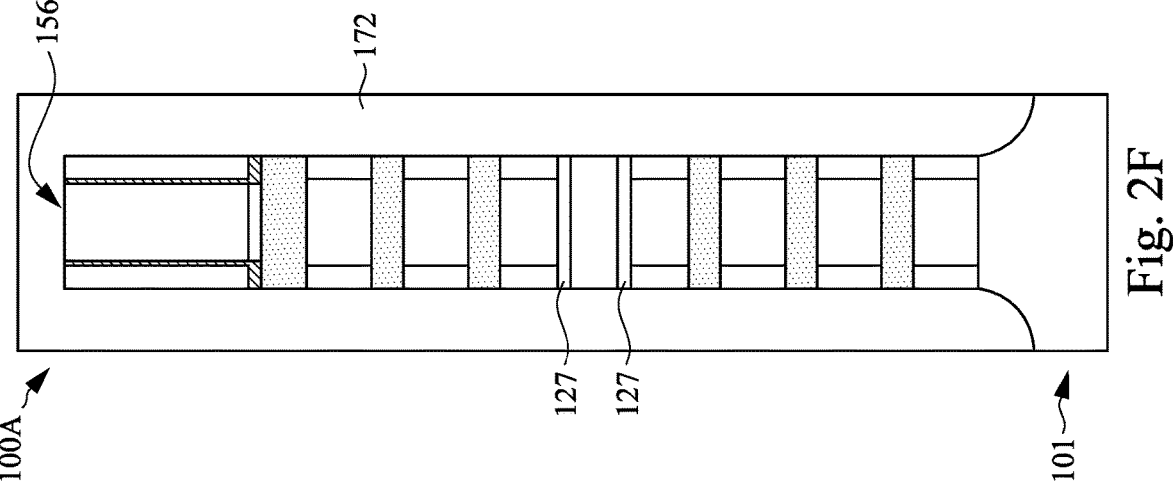
Figure 2E:
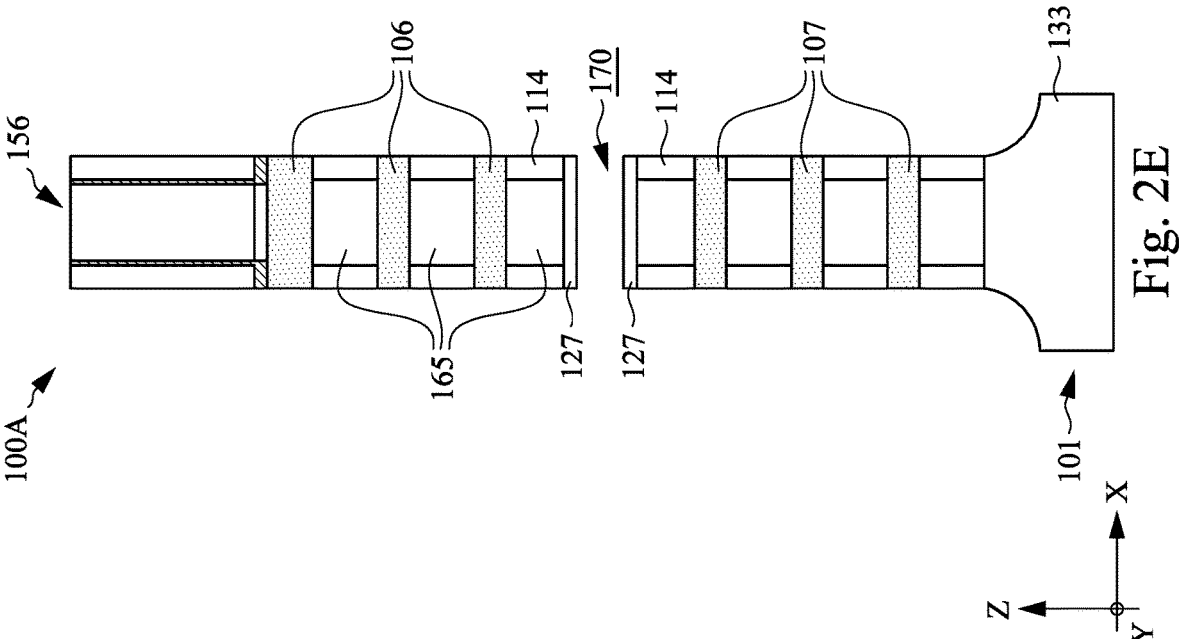

FIG. 2E is an X view of the integrated circuit 100A, in accordance with some embodiments. In FIG. 2E, an etching process has been performed to remove the sacrificial semiconductor layer 154 from between the semiconductor layers 127. The etching process can include an isotropic etch that selectively etches the sacrificial semiconductor layer 154 with respect to the semiconductor nanostructures 106/107, the semiconductor substrate 133, and the sacrificial semiconductor layers 165. Because the sacrificial semiconductor layer 154 has a significantly different concentration of germanium with respect to the sacrificial semiconductor nanostructures 165, the sacrificial semiconductor layer 154 can be etched selectively with respect to the sacrificial semiconductor nanostructures 165 and the semiconductor nanostructures 106/107. In some embodiments, the etching process can include a dry etch process using an etchant of CF4 or HBr gas that etches the sacrificial semiconductor layer 154 at a rate that is higher than 10 times the etching rate of the semiconductor nanostructures 106/107 and the semiconductor layers 127. Other etching processes can be utilized without departing from the scope of the present disclosure.

The result of the etching process in FIG. 2E is that a void 170 is formed between the semiconductor layers 127. As will be described in more detail below, a dielectric layer 129 will be formed in place of the void 170.

FIG. 2F is an X view of the integrated circuit 100A, in accordance with some embodiments. In FIG. 2F, a dielectric layer 172 has been deposited. The dielectric layer 172 is deposited in the void 170 between the semiconductor layers 127, and the source/drain trenches 164, and on the dummy gate structure 156. The dielectric layer 172 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer 172 can be deposited using CVD, ALD, or PVD. Other materials and deposition processes can be used for the dielectric layer 172 without departing from the scope of the present disclosure.

Figure 2H:
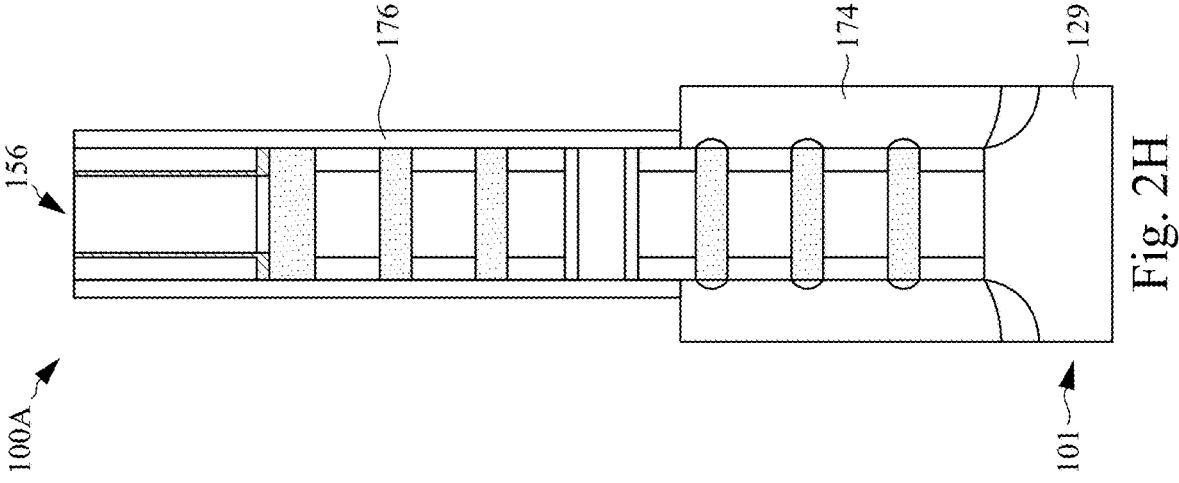
Figure 2G:
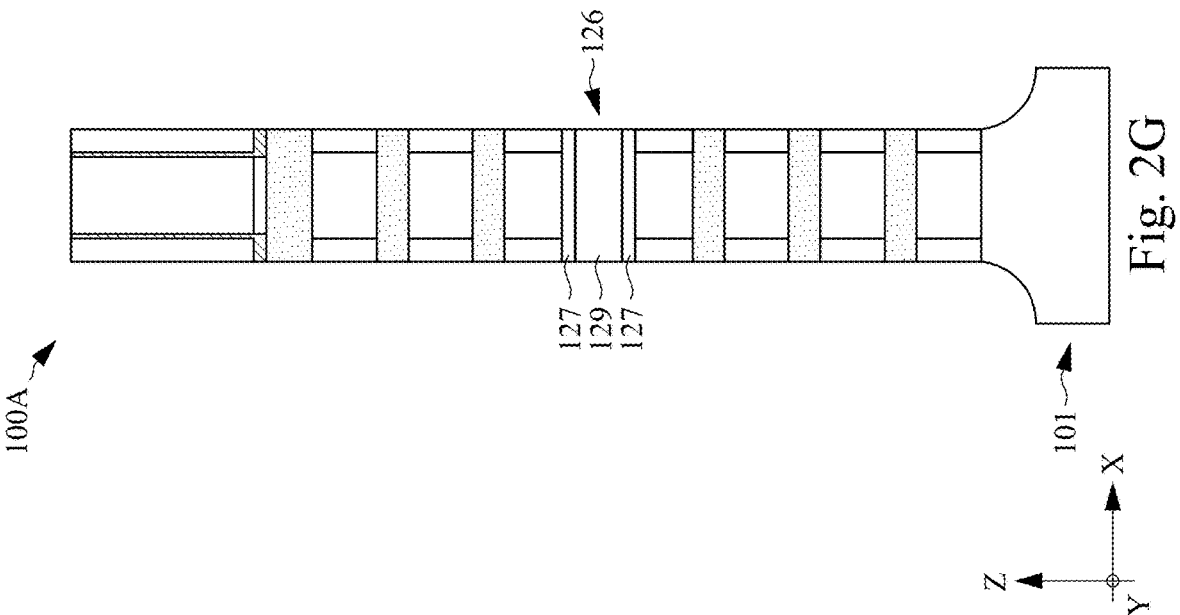

FIG. 2G is an X view of the integrated circuit 100A, in accordance with some embodiments. In FIG. 2G, the dielectric layer 129 has been formed between the semiconductor layers 127. The dielectric layer 129 is formed by performing an etching process on the dielectric layer 172. The etching process can include an anisotropic etch that etches selectively in the downward direction. This etching process removes the dielectric layer 172 from all locations except between the semiconductor layers 127. Accordingly, the dielectric layer 129 is a remnant of the dielectric layer 172.

The dielectric layer 129 and the semiconductor layers 127 may collectively correspond to a hybrid nanosheet that will help provide improved gate metal characteristics, as will be described in more detail below.

While FIG. 2G illustrates the dielectric layer 129 having substantially vertical sidewalls, in practice, the dielectric layer 129 may include concave sidewalls. This can be result of the anisotropic etching process. This may occur because an isotropic etching process may not be perfectly anisotropic. For example, an anisotropic etching process may etch in the downward direction at a rate between 10 and 100 times greater than in lateral directions. Though comparatively small, some etching in the lateral direction occurs, thereby generating concave recesses in the dielectric layer 129. The dielectric layer 129 can have various other configurations without departing from the scope of the present disclosure.

FIG. 2H is an X view of the integrated circuit 100A, in accordance with some embodiments. In FIG. 2H, a layer of polymer material 174 has been deposited in the source/drain trenches 164. Alternatively, the polymer material 174 may be replaced by a non-polymer, dielectric material. After deposition of the polymer material 174, an etch-back process is performed to reduce the height of the polymer material 174 to a level below the lower nanosheet 127.

In FIG. 2H, a dielectric layer 176 has been deposited on the polymer layer 174, and on sidewalls of the dielectric layer 129, the inner spacers 114, the nanostructures 106, and the sidewall spacers 131. In some embodiments, the dielectric layer 176 includes Al2O3. The dielectric layer 176 can be deposited by CVD, PVD, or ALD. Other materials and processes can be utilized for the dielectric layer 176 without departing from the scope of the present disclosure. After deposition of the dielectric layer 176, an anisotropic etching process is performed to remove the dielectric layer 176 from horizontal surfaces of the polymer material 174 and the dummy gate structure 156.

Figure 2J:
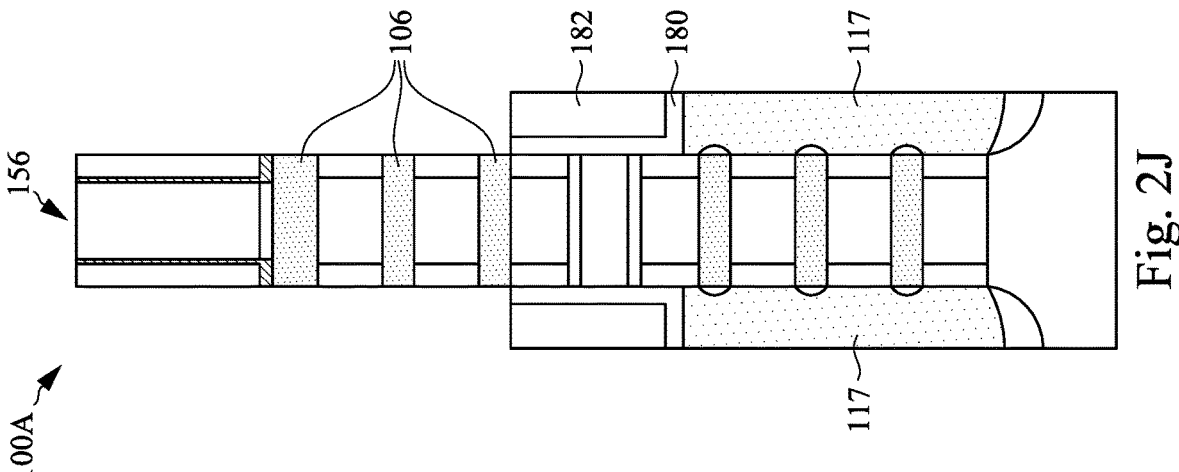
Figure 2I:
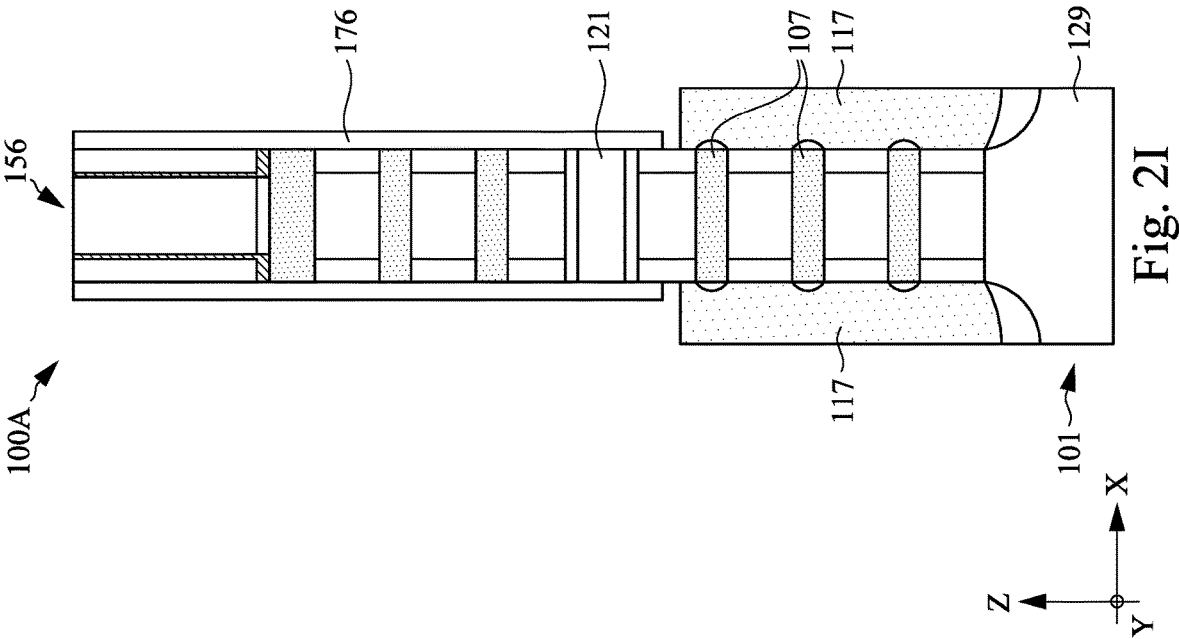

FIG. 2I is an X view of the integrated circuit 100A, in accordance with some embodiments. In FIG. 2I, the polymer layer 174 has been removed. Removal of the polymer layer 174 exposes the sidewalls of the semiconductor nanostructures 107 and the semiconductor substrate 133. In FIG. 2I, source/drain regions 117 have been formed in the source/drain trenches 164 at the locations not covered by the dielectric layer 176. The source/drain regions 117 can be formed by an epitaxial growth from the semiconductor nanostructures 107 and from the semiconductor substrate 133. The source/drain regions 117 include a semiconductor material. The semiconductor material can include a same semiconductor material as the semiconductor nanostructures 107. Alternatively, the semiconductor material of the source/drain regions 117 can be different than the semiconductor material of the semiconductor nanostructures 107. The source/drain regions 117 may be doped in situ with dopant atoms during the epitaxial growth process. In the example in which the lower transistor 105 is a P-type transistor, the source/drain regions 117 may be doped in situ with P-type dopant atoms. The P-type dopant atoms can include boron or other P-type dopant atoms.

FIG. 2J is an X view of the integrated circuit 100A, in accordance with some embodiments. In FIG. 2J, the dielectric layer 176 has been removed. A dielectric layer 180 has been deposited. A polymer layer 182 has also been deposited. The dielectric layer 180 can include a same material as the dielectric layer 176. The polymer layer 182 can have a same material as the polymer material 174. An etch-back process has also been performed to reduce the height of the dielectric layer 180 and the polymer material 182 to expose the sidewalls of the semiconductor nanostructures 106.

Figure 2L:
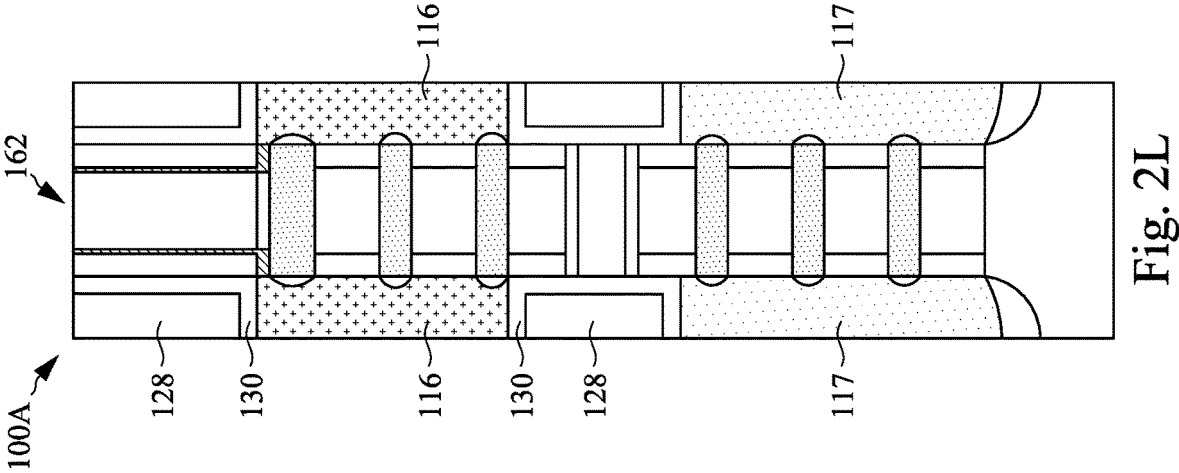
Figure 2K:
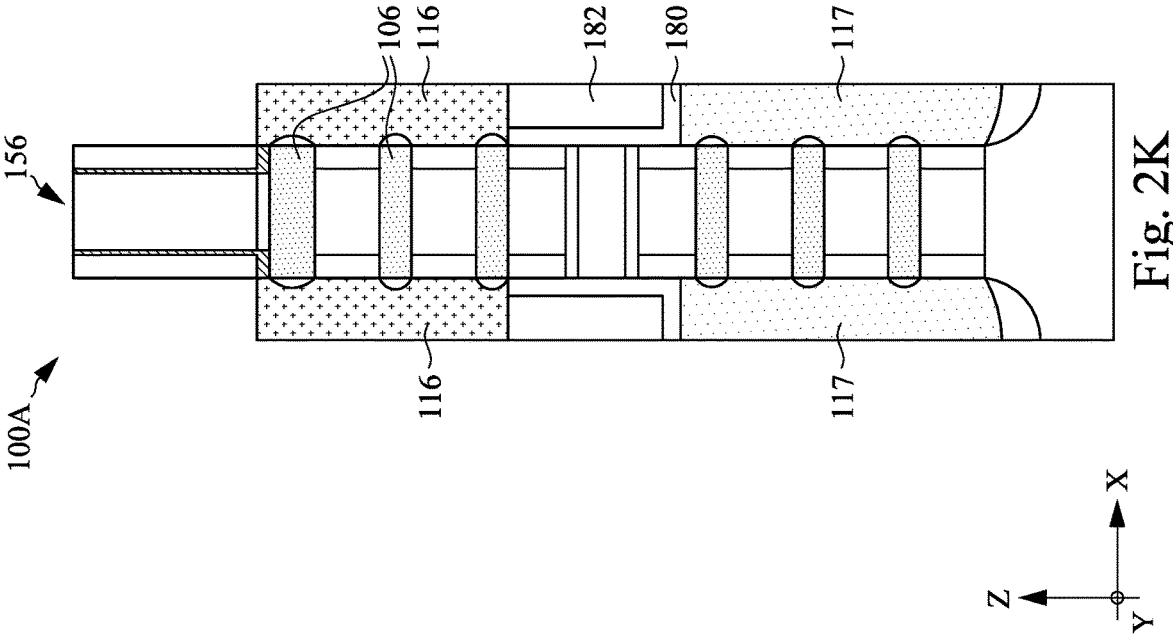

FIG. 2K is an X view of the integrated circuit 100A, in accordance with some embodiments. In FIG. 2K, source/drain regions 116 have been formed in the source/drain above the dielectric layer 180 and the polymer material 182. The source/drain regions 116 can be formed by an epitaxial growth from the semiconductor nanostructures 106. The source/drain regions 116 include a semiconductor material. The semiconductor material can include a same semiconductor material as the semiconductor nanostructures 106. Alternatively, the semiconductor material of the source/drain regions 116 can be different than the semiconductor material of the semiconductor nanostructures 106. The source/drain regions 116 may be doped in situ with dopant atoms during the epitaxial growth process. In the example in which the upper transistor 104 is an N-type transistor, the source/drain regions 116 may be doped in situ with N-type dopant atoms. The N-type dopant atoms can include phosphorus or other N-type dopant atoms.

FIG. 2L is an X view of the integrated circuit 100A, in accordance with some embodiments. In FIG. 2L, the polymer material 182 and the dielectric layer 180 has been removed. A dielectric layer 130 has been deposited with a conformal deposition process. The dielectric layer 130 is deposited on the exposed sidewalls of the inner spacers 114, the semiconductor layers 127, and the dielectric layer 129 between the source/drain regions 116 and the source/drain regions 117. The dielectric layer 130 is also deposited on the top surface of the source/drain regions 117, the bottom, side, and top surfaces of the source/drain regions 116, and on the sidewall spacers 131 of the dummy gate structure 156. The dielectric layer 130 can be deposited by CVD, ALD, or other suitable processes. The dielectric layer 130 may include a contact-etching stop-layer (CESL). The dielectric layer 130 may include one or more of silicon oxide, silicon nitride, silicon oxynitride, silicon carbonitride, silicon oxycarbonitride, fluorine-doped silicate glass (FSG), a low-K dielectric material or other dielectric materials.

An interlevel dielectric layer 128 has been deposited covering the dielectric layer 130. The interlevel dielectric layer 128 can include one or more of silicon oxide, silicon nitride, silicon oxynitride, silicon carbonitride, silicon oxycarbonitride, fluorine-doped silicate glass (FSG), a low-K dielectric material or other dielectric materials. The interlevel dielectric layer can be deposited by CVD, PVD, or ALD. Other materials and dimensions can be utilized for the dielectric layers 128 and 130 without departing from the scope of the present disclosure.

Figure 2M:
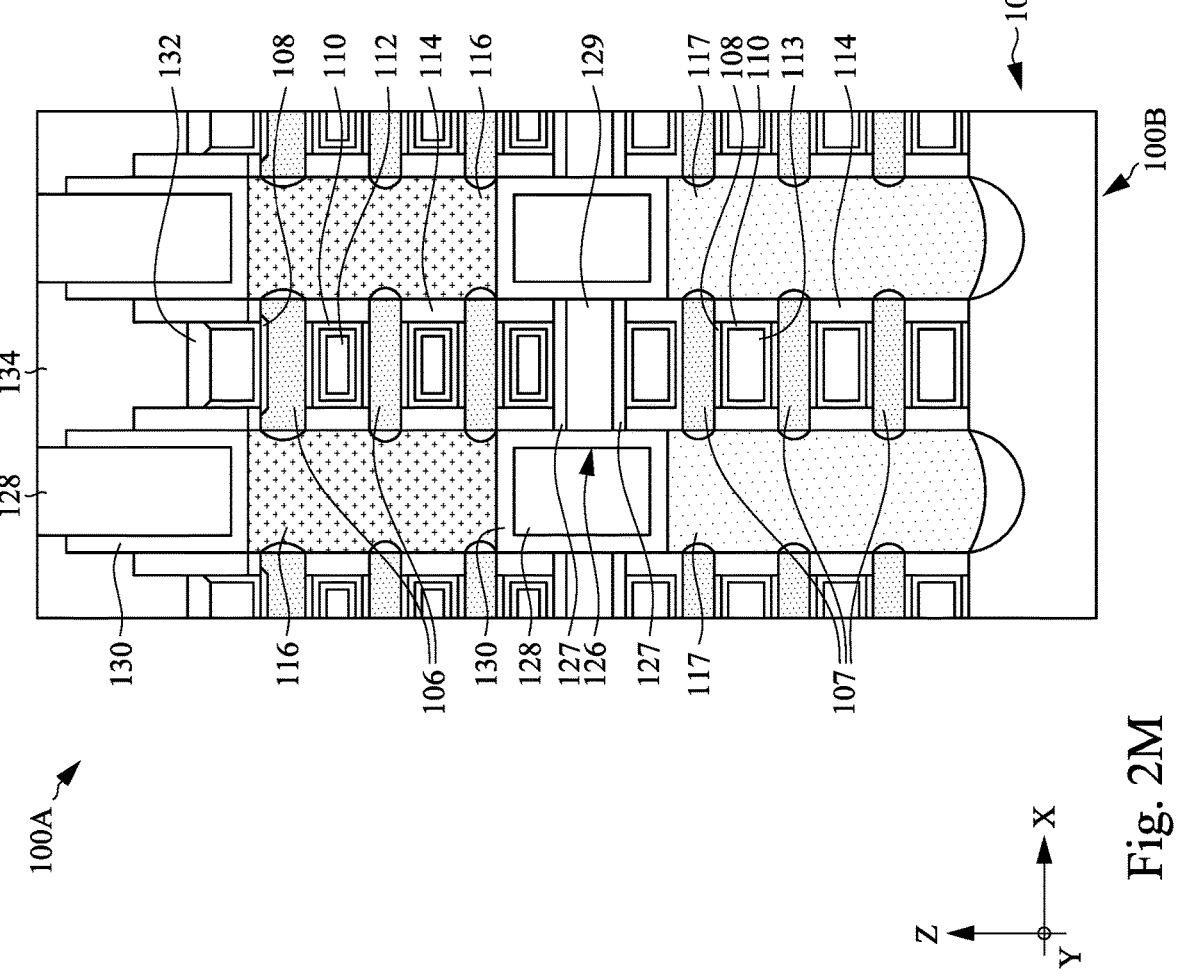

FIG. 2M is an X view of the integrated circuit 100A, in accordance with some embodiments. The X view of FIG. 2M is laterally expanded with respect to FIG. 2L, thereby showing portions of laterally adjacent transistors. The dummy gate structure 156 has been removed. After removal of the dummy gate structure 156, the sacrificial semiconductor nanostructures 165 are removed with an etching process that selectively removes the sacrificial semiconductor nanostructures 165 with respect to the semiconductor nanostructures 106/107.

After removal of the sacrificial semiconductor nanostructures 165, a gap remains where the sacrificial semiconductor nanostructures 165 were. The semiconductor nanostructures 106/107 are exposed. The interfacial gate dielectric layer 108 and the high-K gate dielectric layer 110 are then then deposited surrounding the semiconductor nanostructures 106/107. The interfacial gate dielectric layer 108 may include silicon oxide of a thickness between 2 Å and 10 Å.

The high-K dielectric layer 110 is deposited on the interfacial gate dielectric layer 108 and may include hafnium oxide. The high-K dielectric layer may have a thickness between 5 Å and 20 Å. The materials of the gate dielectric layers 108 and 110 may be deposited by ALD, CVD, or PVD. Other structures, materials, thicknesses, and deposition processes may be utilized for the gate dielectric layer without departing from the scope of the present closure.

After deposition of the interfacial gate dielectric layer 108 and the high-K gate dielectric layer 110 around the semiconductor nanostructures 106/107, a gate metal 113 is deposited. The gate metal 113 may be deposited by PVD, CVD, ALD, or other suitable processes. The material or materials of the gate metal 113 are selected to provide a desired work function with respect to the semiconductor nanostructures 107 of the P-type transistor 105. In one example, the gate metal 113 includes titanium aluminum. However, other conductive materials can be utilized for the gate metal 113 without departing from the scope of the present disclosure.

When the gate metal 113 is initially deposited, the gate metal 113 surrounds the semiconductor nanostructures 106 and the semiconductor nanostructures 107. However, the gate metal 113 has a material that provides a desired work function for the lower transistor 105 and the gate metal 113 may not provide a desired work function for the upper transistor 104. Accordingly, an etch-back process is performed. The etch-back process removes the gate metal 113 to a level well below the lowest semiconductor nanostructure 106. In some embodiments, the etch-back process removes the gate metal 113 to a level that is about the vertical middle of the dielectric layer 129.

Because the dielectric layer 129 is present, the etch-back process can have a duration that reliably removes all of the gate metal 113 from directly between the dielectric layer 129 and the lowest semiconductor nanostructure 106, without removing the gate metal 113 from between the highest semiconductor nanostructure 107 and the dielectric layer 129. The result is that the gate metal 113 cannot interfere with the work function of the upper transistor 104.

After the etch-back process of the gate metal 113, a gate metal 112 is deposited. The gate metal 112 can be deposited using ALD, PVD, CVD, or other suitable deposition processes. In one example, the gate metal 112 includes titanium nitride. Alternatively, the gate metal 112 can include any other suitable conductive material. The gate metal 112 surrounds the semiconductor nanostructures 106. In particular, the gate metal 112 is in contact with the high-K gate dielectric 110 around the semiconductor nanostructures 106. The material of the gate metal 112 is selected to provide a desired work function for the transistor 104.

After deposition of the gate metal 112, an etch-back process is performed to reduce the height of the gate metal 112 above the top semiconductor nanostructure 106. After the etch-back process of the gate metal 112, a gate cap metal 132 is deposited on the gate metal 112. The gate cap metal 132 can include tungsten, fluorine-free tungsten, or other suitable conductive materials. The gate cap metal 132 can be deposited by PVD, CVD, ALD, or other suitable deposition processes. The gate cap metal 132 may have a vertical thickness between 1 nm and 10 nm. Other dimensions can be utilized without departing from the scope of the present disclosure.

After deposition of the gate cap metal 132, a dielectric layer 134 is deposited. The dielectric layer 134 can include silicon oxide, silicon nitride, silicon oxynitride, silicon carbonitride, silicon oxycarbonitride, fluorine-doped silicate glass (FSG), a low-K dielectric material or other dielectric materials. The dielectric layer 134 can be deposited by PVD, CVD, ALD, or other suitable deposition processes.

FIGS. 3A-3D are diagrammatic perspective views of an integrated circuit 100A at intermediate stages of forming a conductive TSL 450 in accordance with various embodiments. FIGS. 4A-4D are diagrammatic perspective views of an integrated circuit 100A at intermediate stages of forming a conductive TSL 450 in accordance with various other embodiments. Most elements of integrated circuit 100A are omitted from view in FIGS. 3A-3D and FIGS. 4A-4D for clarity of illustration.

Figures 4A, 4B:
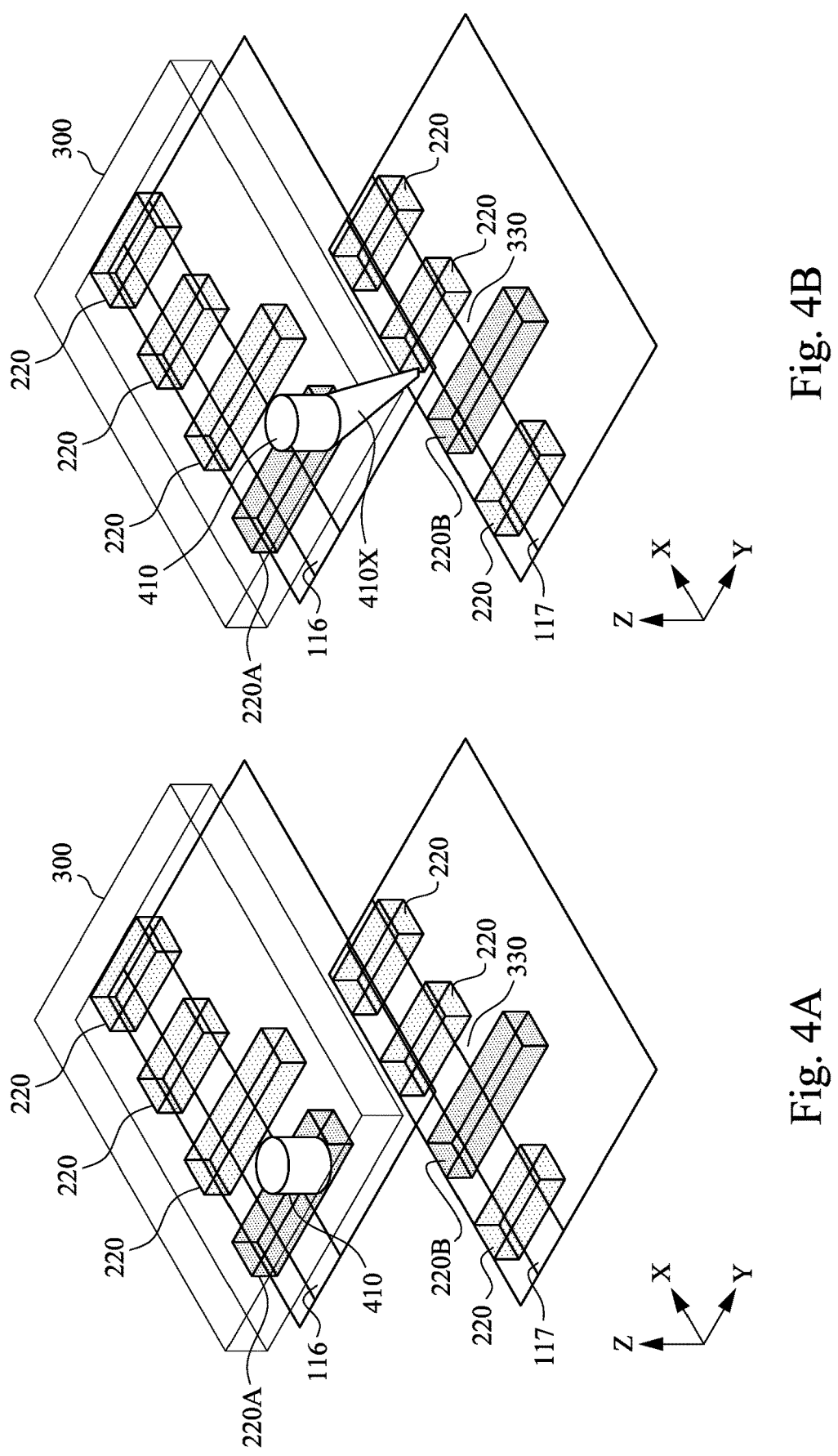
FIGS. 4A-4D are diagrammatic perspective views of an integrated circuit at various stages of processing, in accordance with some embodiments.
Figures 4C, 4D:
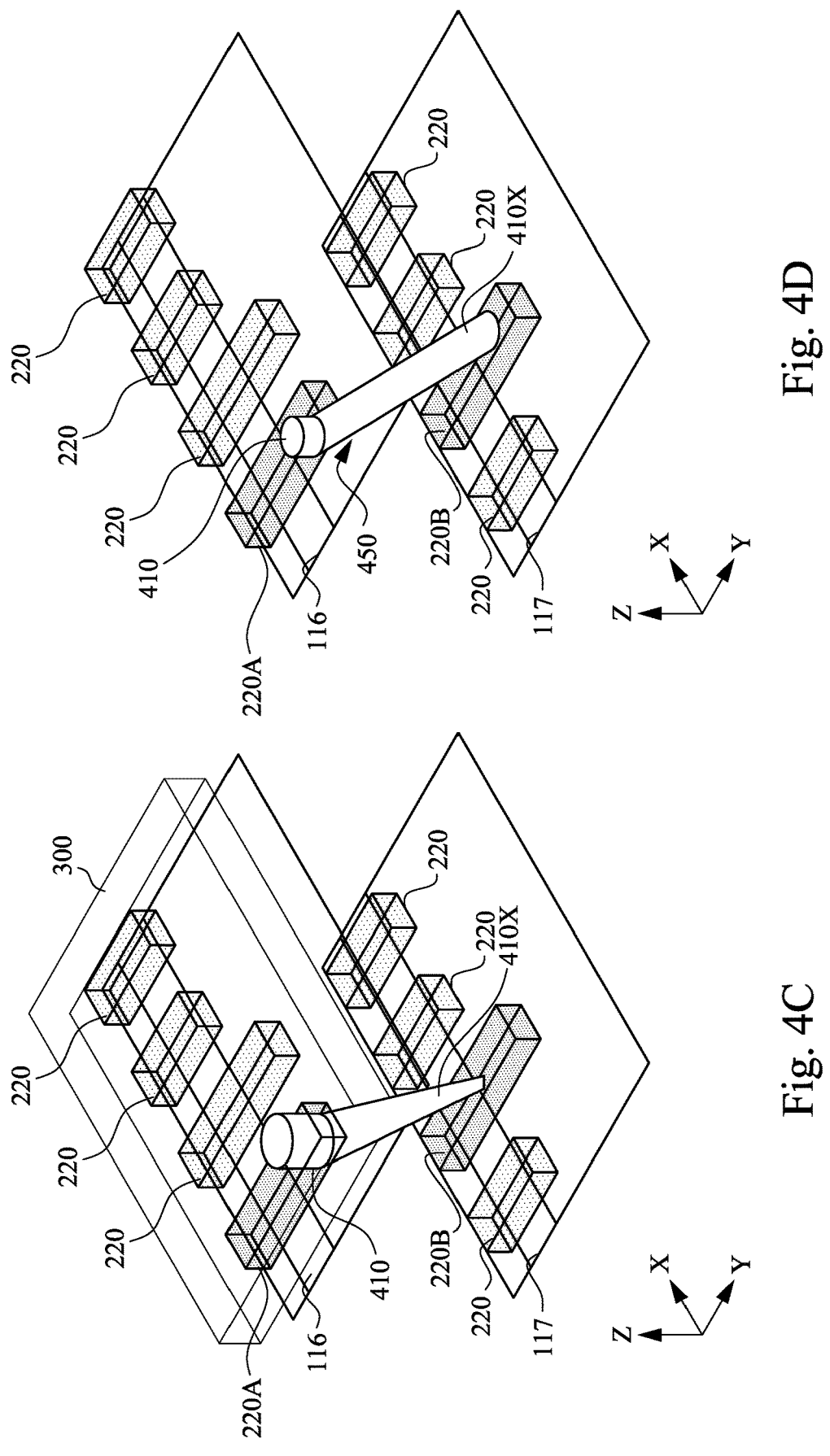
Figure 5:
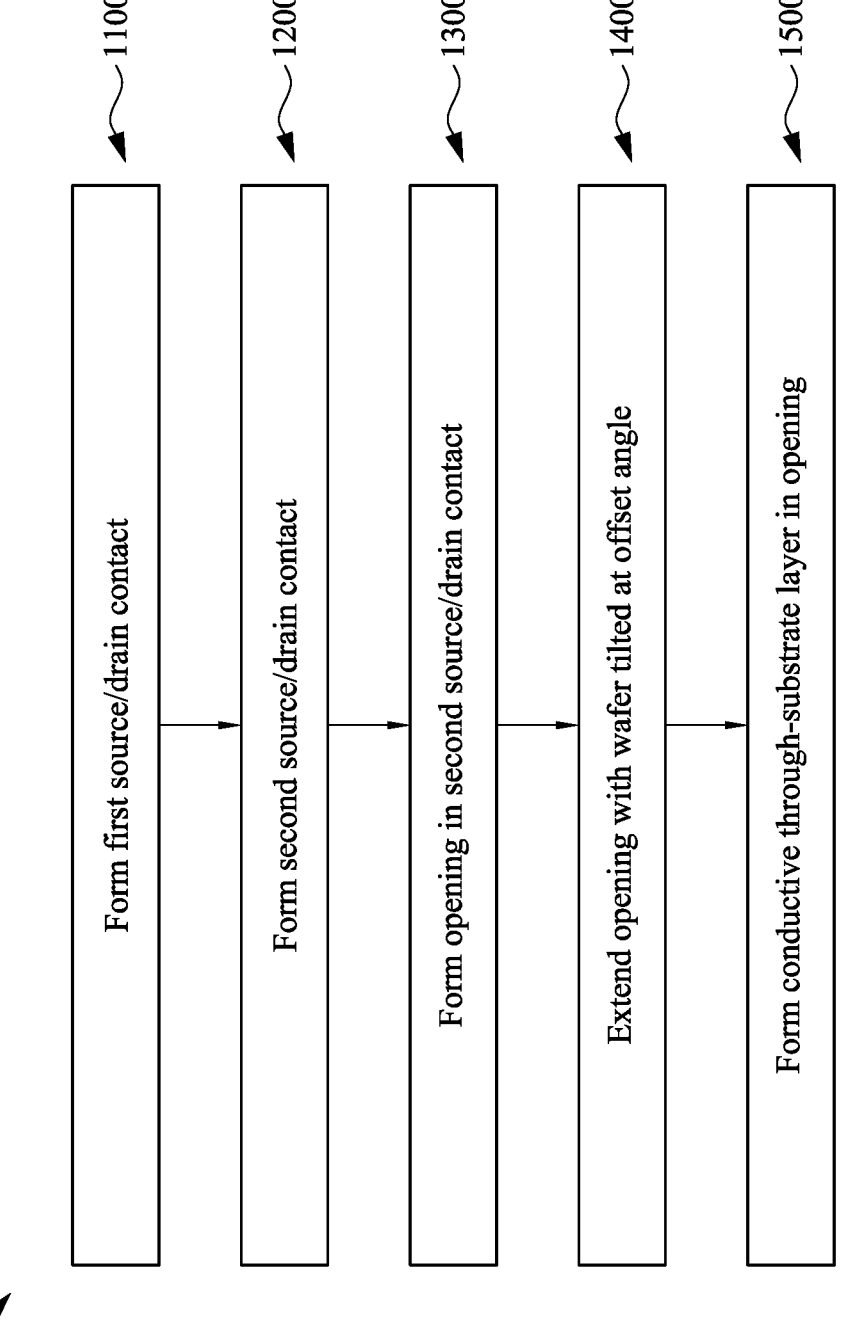
FIGS. 5 and 6 are flow diagrams of processes for forming an integrated circuit, in accordance with some embodiments.
Figure 6:
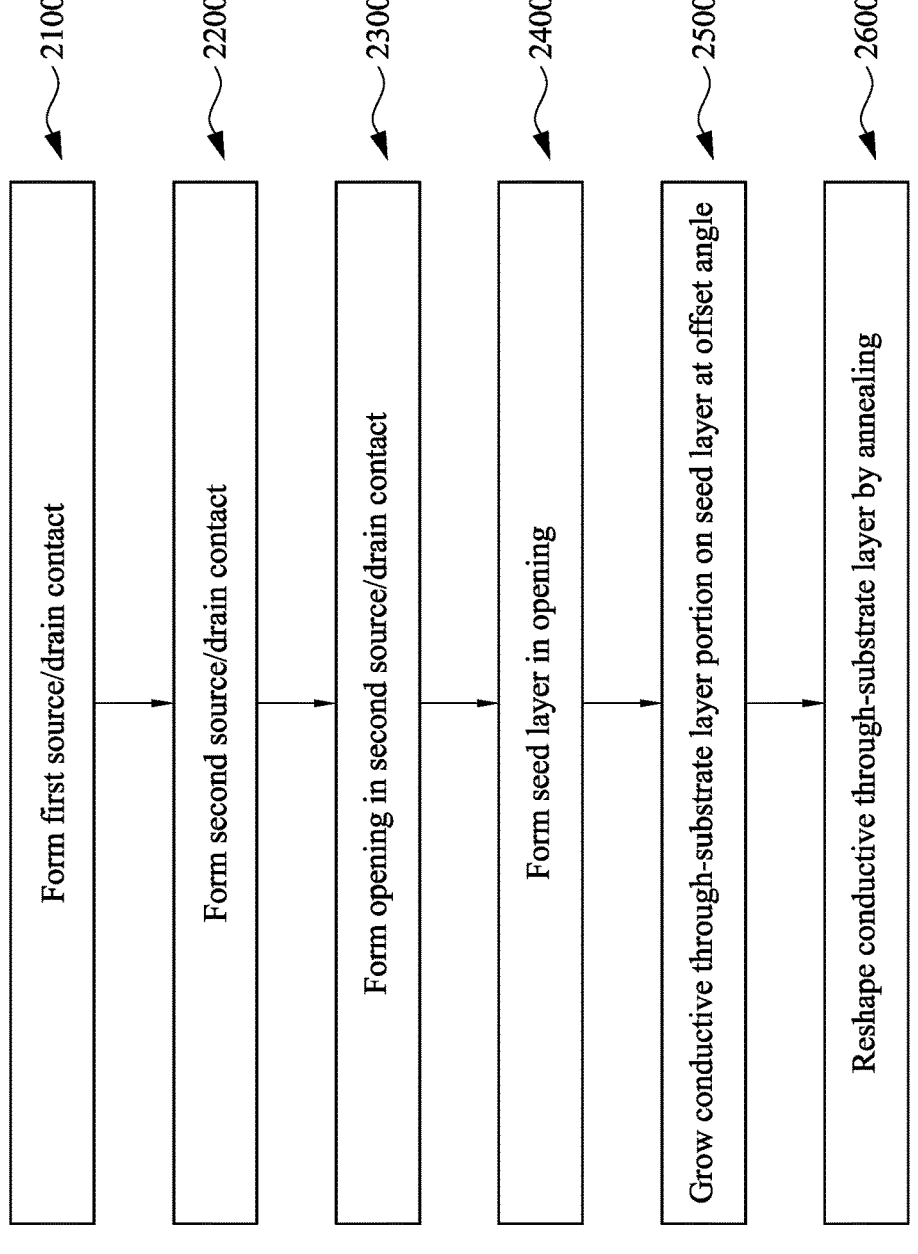

FIGS. 5 and 6 illustrate flowcharts of methods of forming an integrated circuit in accordance with various embodiments. The method 1000 depicted in FIG. 5 may be used to form the integrated circuit 100A as illustrated in FIGS. 3A-3D, and the method 1000 depicted in FIG. 6 may be used to form the integrated circuit 100A as illustrated in FIGS. 4A-4D. In some embodiments, the methods 1000, 2000 for forming the semiconductor structures include a number of operations. The methods 1000, 2000 for forming the semiconductor structures will be further described according to one or more embodiments. It should be noted that the operations of the methods 1000, 2000 may be rearranged or otherwise modified within the scope of the various aspects. It should further be noted that additional processes may be provided before, during, and after the methods 1000, 2000, and that some other processes may be only briefly described herein.

Figures 3A, 3B:
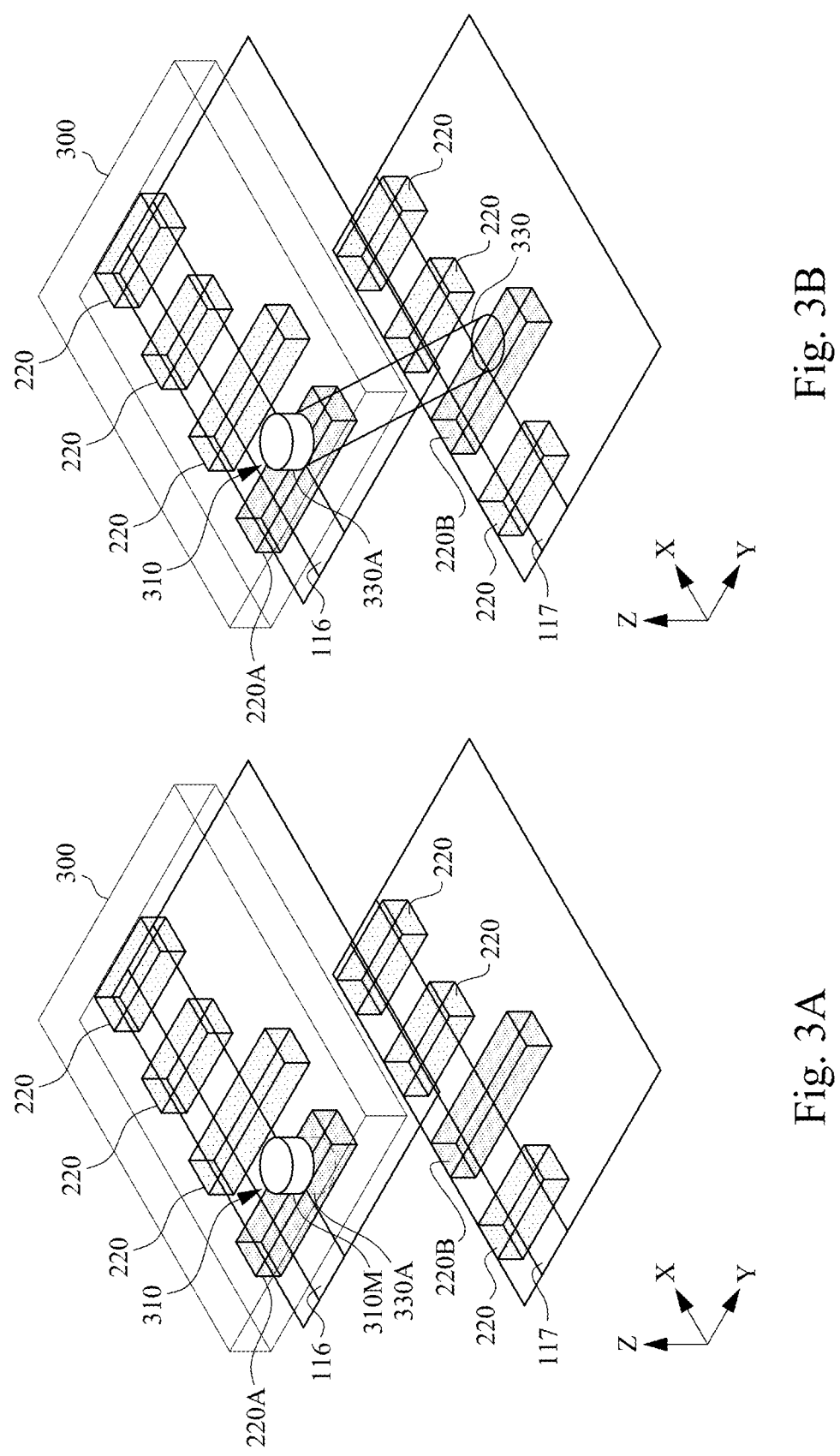
FIGS. 3A-3D are diagrammatic perspective views of an integrated circuit at various stages of processing, in accordance with some embodiments.

FIG. 3A is a diagrammatic perspective view of integrated circuit 100A in accordance with various embodiments. Most elements are removed from view in FIG. 3A for clarity of illustration. Integrated circuit 100A includes source/drain contacts 220 that are in contact with source/drain regions 116, 117. A first source/drain contact is labeled 220A and a second source/drain contact is labeled 220B. The source/drain contacts 220, 220A, 220B are embodiments of the source/drain contacts 118, 119 of FIGS. 1C, 1E. The source/drain contact 220A may be a frontside source/drain contact and the source/drain contact 220B may be a backside source/drain contact. The source/drain contact 220A may be a backside source/drain contact and the source/drain contact 220B may be a frontside source/drain contact. It should be understood that "frontside" and "backside" refer to two different sides of integrated circuit 100A. Referring to FIG. 2M, "backside" refers to a side 100B where the substrate (e.g., the substrate 101) is or was located. "Frontside" refers to a side above devices (e.g., the transistors 104, 105) that is opposite the backside.

In FIG. 3A, first source/drain contact 220A is formed, corresponding to acts 1100, 2100 of methods 1000, 2000, respectively. The first source/drain contact 220A may be a frontside source/drain contact formed on source/drain region 116, as shown. In some embodiments, the first source/drain contact 220A is formed on source/drain region 117. Namely, the first source/drain contact may be a backside source/drain contact. The first source/drain contact 220A may be similar to or the same as the source/drain contacts 118, 119. The first source/drain contact 220A may be formed by etching an opening, then depositing material of the first source/drain contact 220A in the opening by a suitable deposition operation, such as a PVD, CVD, ALD or the like.

In FIG. 3A, second source/drain contact 220B is formed, corresponding to acts 1200, 2200 of methods 1000, 2000, respectively. The second source/drain contact 220B may be a backside source/drain contact formed on source/drain region 117, as shown. In some embodiments, the second source/drain contact 220B is formed on source/drain region 116. Namely, the first source/drain contact may be a frontside source/drain contact. The second source/drain contact 220B may be similar to or the same as the source/drain contacts 118, 119. The second source/drain contact 220B may be formed by etching an opening, then depositing material of the second source/drain contact 220B in the opening by a suitable deposition operation, such as a PVD, CVD, ALD or the like.

The first and second source/drain contacts 220A, 220B are on different levels of integrated circuit 100A. Namely, the first source/drain contact 220A may be coupled to or in contact with an upper source/drain region of an upper transistor, and the second source/drain contact 220B may be coupled to or in contact with a lower source/drain region of a lower transistor. The upper source/drain region and the lower source/drain region may be of different type from each other. For example, the upper source/drain region may be N-type and the lower source/drain region may be P-type. For example, the upper source/drain region may be P-type and the lower source/drain region may be N-type.

In FIG. 3A, a mask 300 is formed on the first source/drain contact 220A. The mask 300 may be any suitable mask, and may be or include one or more layers of photoresist, anti-reflective coating (ARC) layers, hard masks (e.g., SiN) or the like. Following formation of the mask 300, an opening 310M is formed in the mask 300. The opening 310M may be formed by patterning the mask 300, for example, by exposing photoresist of the mask 300 to light of a selected wavelength, such as extreme ultraviolet (EUV) light. The opening 310M may be formed by one or more etching operations. The opening 310M exposes the first source/drain contact 220A, such as an upper surface of the first source/drain contact 220A.

In FIG. 3A, vertical opening 330A is formed by extending opening 310 into or through (e.g., entirely through) the first source/drain contact 220A, corresponding to acts 1300, 2300 of method 1000, 2000, respectively. Vertical opening 330A may expose material of structure underlying the first source/drain contact 220A. The exposed material may be material of an interlayer dielectric (ILD) that is between the first source/drain contact 220A and the second source/drain contact 220B.

In FIG. 3B, following formation of vertical opening 330A through the first source/drain contact 220A, the opening 310 is further extended, as shown, corresponding to act 1400 of method 1000. An oblique portion 330 of the opening 310 is shown in FIG. 3B. The oblique portion 330 may expose the second source/drain contact 220B.

The oblique portion 330 may be formed by an etching operation, such as a plasma etching operation or the like. The etching operation is performed while a wafer on which integrated circuit 100A is positioned is tilted or rotated. A tilt angle or offset angle may be controlled by a wafer stage on which the wafer is mounted. The tilt angle of the wafer stage may correspond to a selected tilt angle that is associated with, for example, shortest distance between the first source/drain contact 220A and second source/drain contact 220B. For example, an imaginary line may be drawn from a center of the opening in the first source/drain contact 220A to a center along the X-axis direction of the second source/drain contact 220B. The imaginary line may have angular offset (or tilt) relative to vertical (e.g., normal to major surface of substrate 101). The tilt angle may be in a range of about 10 degrees to 70 degrees, such as in a range of about 10 degrees to about 40 degrees, in a range of about 20 degrees to about 30 degrees or another suitable range. In some embodiments, the tilt angle may exceed 40 degrees, for example, when the first and second source/drain contacts 220A, 220B are offset from each other along the X-axis direction by a large distance. For example, while the first and second source/drain contacts 220A, 220B depicted in FIGS. 3A-3D are adjacent along the X-axis direction, this is not necessary. In some embodiments, one or more source/drain contacts 220 are intervening between the first and second source/drain contacts 220A, 220B along the X-axis direction. For example, the oblique portion 330 may extend from the first source/drain contact 220A to another source/drain contact not illustrated in FIGS. 3A-3D. In this case, the tilt angle may exceed 40 degrees, such as being in a range of about 40 degrees to about 70 degrees, or higher.

The oblique portion 330 may extend in parallel with a first direction, which may be the X-axis direction illustrated in FIG. 3B. The first direction may be perpendicular to a second direction (e.g., the Y-axis direction) in which the first source/drain contact 220A extends. Extending entirely in parallel with the first direction is not necessary, and deviations from parallel with the first direction are also embodiments herein.

The oblique portion 330 may have cross-sectional profile in the XY-plane that is substantially the same as that of a vertical portion 330A. The oblique portion 330 may be cylindrical in shape. In some embodiments, the oblique portion 330 has tapered sidewalls and is conical in shape, narrowing toward the second source/drain contact 220B.

Figures 3C, 3D:
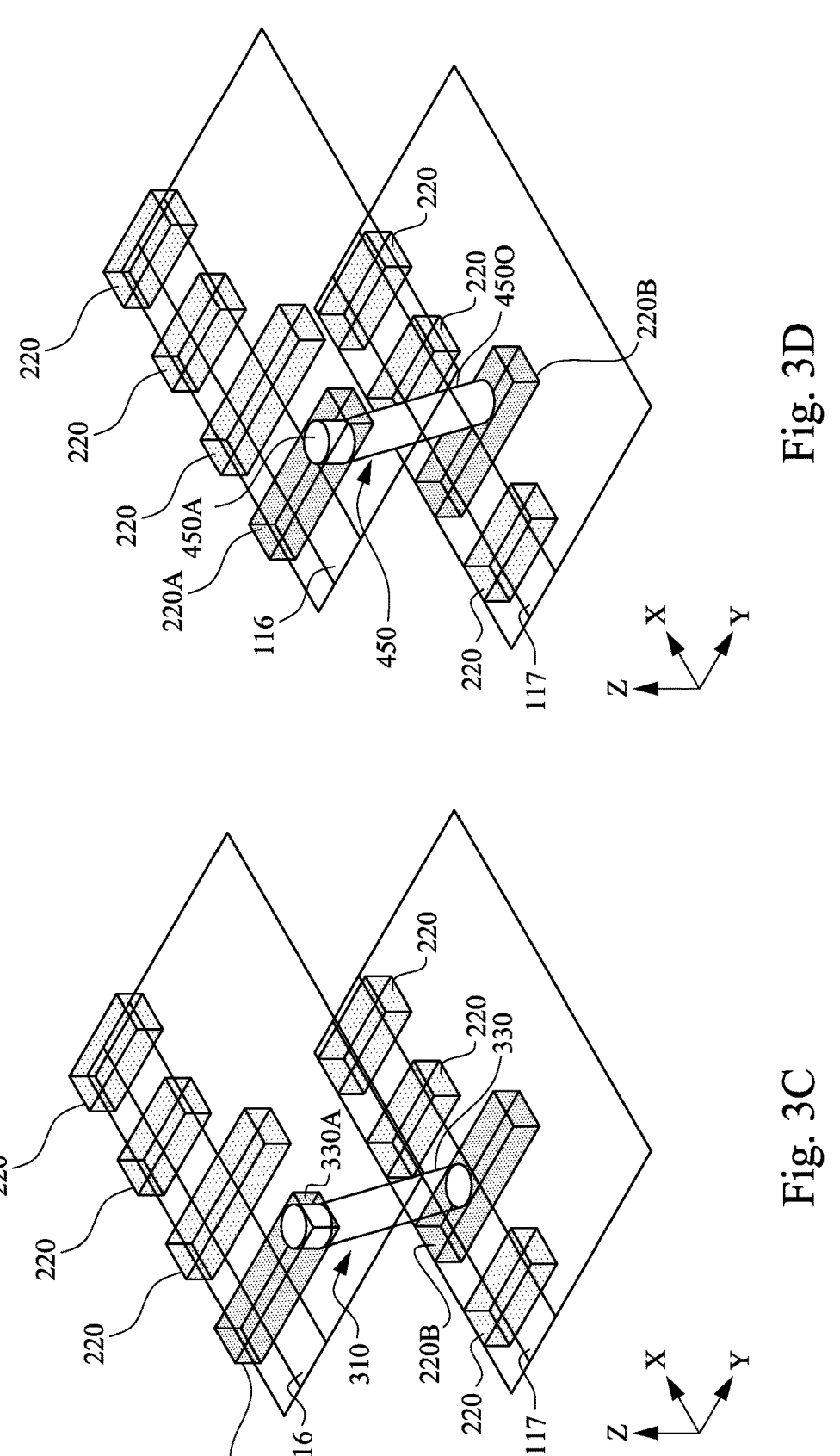

FIG. 3C shows the resulting structure after forming the oblique portion 330 of the opening 310 and removing the mask 300. The opening 310 includes a vertical portion 330A that extends through the first source/drain contact 220A, and the oblique portion 330 that extends from the first source/drain contact 220A to the second source/drain contact 220B. In some embodiments, following removal of the mask 300, an ashing operation is performed to remove byproducts of etching that formed the opening 310.

In FIG. 3D, the conductive TSL 450 is formed in the opening 310, corresponding to act 1500 of method 1000. The conductive TSL 450 may be formed by a suitable deposition operation, such as a PVD, CVD, ALD or the like. In some embodiments, the conductive TSL 450 is or includes one or more metals, such as ruthenium, tungsten, cobalt, nickel, aluminum, copper, gold, alloys thereof, multilayers thereof and the like. In some embodiments, the conductive TSL 450 is ruthenium. The conductive TSL 450 may inherit the shape of the opening 310. For example, the conductive TSL 450 may extend from an upper surface of the first source/drain contact 220A, vertically through the first source/drain contact 220A, at an angle toward the second source/drain contact 220B and may land on the second source/drain contact 220B. The conductive TSL 450 may include a vertical portion 450A that extends in the vertical direction through the first source/drain contact 220A and an oblique portion 4500 that extends from the first source/drain contact 220A to the second source/drain contact 220B at an offset angle from the vertical direction.

The method 1000 for forming the conductive TSL 450 is beneficial due to only using a single mask to form the opening 310 in which the conductive TSL 450 is formed. As such, process flow may be simplified, and cost may be reduced. The method 1000 may be performed without use of time mode or "timed" etching, which would otherwise be difficult to perform due to a lack of element byproduct information at the etching operation. This also simplifies formation of the opening 310.

Although FIGS. 3A-3D are described in the case that the second source/drain contact 220B is formed prior to forming the conductive TSL 450, it should be understood that this is not a requirement. For example, in many integrated circuits, a frontside interconnect structure that includes many metal interconnect layers over the first source/drain contact 220A is formed prior to forming a backside interconnect structure that may include the second source/drain contact 220B. As such, the conductive TSL 450 may be formed prior to forming the frontside interconnect structure and prior to forming the second source/drain contact 220B. For example, after forming the first source/drain contact 220A, the conductive TSL 450 may be formed at an angle and to a depth so as to land at a position at which the second source/drain contact 220B is to be formed. Then, following formation of the frontside interconnect structure over the first source/drain contact 220A, the wafer may be flipped, and the substrate 101 may be removed, thereby exposing the underside of the conductive TSL 450. After exposing the conductive TSL 450, the second source/drain contact 220B may be formed on the conductive TSL 450.

In another example, the first source/drain contact 220A may be a backside source/drain contact and the second source/drain contact 220B may be a frontside source/drain contact. In this case, the frontside interconnect structure may have been formed on the second source/drain contact 220B in an operation prior to forming the first source/drain contact 220A. As such, the conductive TSL 450 may be formed following formation of the second source/drain contact 220B as described with reference to FIGS. 3A-3D, namely with the second source/drain contact 220B in place. Then, the remaining metal layer(s) of the backside interconnect structure may be formed over the first source/drain contact 220A following formation of the conductive TSL 450.

FIGS. 4A-4D are diagrammatic perspective views of forming a conductive TSL 450 in accordance with various embodiments. In FIGS. 4A-4D, the conductive TSL 450 is grown from a seed layer using directional ALD.

In FIG. 4A, first and second source/drain contacts 220A, 220B are formed, corresponding to acts 2100, 2200 of method 2000, similar to described with reference to FIG. 3A. Following formation of the first source/drain contact 220A, a mask 300 is formed, which is similar to the description of FIG. 3A. An opening is formed in the mask 300 that exposes the first source/drain contact 220A, then the opening is extended vertically through the first source/drain contact 220A. Following extending of the opening vertically through the first source/drain contact 220A, a seed layer 410 is formed in the opening, corresponding to act 2400 of method 2000. The seed layer 410 may extend through the mask 300 and the opening in the first source/drain contact 220A. In some embodiments, the seed layer 410 includes ruthenium, tungsten, cobalt, nickel, aluminum, copper, gold or the like. In some embodiments, the seed layer 410 is ruthenium. In some embodiments, material of the seed layer 410 is different than that of the first and second source/drain contacts 220A, 220B to promote selective growth of an oblique portion 410X (see FIG. 4B) on the seed layer 410 and not on the first and second source/drain contacts 220A, 220B or the source/drain contacts 220.

In FIG. 4B, an oblique portion 410X is grown on the seed layer 410 at an offset angle, corresponding to act 2500 of method 2000. Details of the offset angle may be similar to those of the tilt angle described above with reference to FIGS. 3A-3D. The oblique portion 410X may be grown by a directional ALD operation that has the offset angle and grows the oblique portion 410X with a non-orthogonal (e.g., non-vertical) profile. In some embodiments, the mask 300 shown in FIG. 4B is not present during the directional ALD operation, namely, the mask 300 may be removed prior to performing the directional ALD operation. The offset angle may be selected by tilting the wafer stage on which the wafer having the integrated circuit 100A thereon is mounted.

In FIG. 4C, growth of the oblique portion 410X continues until the oblique portion 410X lands on (e.g., contacts) the second source/drain contact 220B. As shown in FIG. 4B and FIG. 4C, during growth of the oblique portion 410X, the oblique portion 410X may have a conical shape, which narrows with increased proximity to the second source/drain contact 220B. Similar to the conductive TSL 450 of FIG. 3D, the oblique portion 410X may extend parallel to the X-axis direction.

In FIG. 4D, after the oblique portion 410X contacts the second source/drain contact 220B, an anneal operation may be performed for improving profile of the oblique portion 410X and improving connection between the oblique portion 410X and the second source/drain contact 220B, corresponding to act 2600 of method 2000. The anneal operation may reduce contact resistance between the oblique portion 410X and the second source/drain contact 220B. Annealing can reduce contact resistance between metals of the oblique portion 410X and the second source/drain contact 220B by improving quality of a metal-to-metal interface therebetween. When two metal surfaces are brought into contact, microscopic irregularities and impurities may be present that prevent a good electrical connection from forming. The surface imperfections can increase the contact resistance, which in turn can cause heating and other problems. The annealing operation may involve heating the metals to a high temperature and then allowing the metals to cool slowly. The annealing process may be beneficial to smooth out the surface irregularities and redistribute any impurities, resulting in a more uniform and cleaner metal-to-metal interface. The improved metal-to-metal interface can then lead to lower contact resistance between the two metals. Annealing may also improve mechanical properties of the two metals, such as hardness and ductility thereof, which may improve resistance of the metals to deformation and wear, which may also be beneficial to reduce contact resistance over time.

It should be understood that, similar to the description of FIGS. 3A-3D, FIGS. 4A-4D are described in the case that the second source/drain contact 220B is formed prior to forming the conductive TSL 450, but this is not a requirement. For example, in many integrated circuits, a frontside interconnect structure that includes many metal interconnect layers over the first source/drain contact 220A is formed prior to forming a backside interconnect structure that may include the second source/drain contact 220B. As such, the conductive TSL 450 may be formed prior to forming the frontside interconnect structure and prior to forming the second source/drain contact 220B. For example, after forming the first source/drain contact 220A, the conductive TSL 450 may be formed at an angle and to a depth so as to land at a position at which the second source/drain contact 220B is to be formed. Then, following formation of the frontside interconnect structure over the first source/drain contact 220A, the wafer may be flipped, and the substrate 101 may be removed, thereby exposing the underside of the conductive TSL 450. After exposing the conductive TSL 450, the second source/drain contact 220B may be formed on the conductive TSL 450.

In another example, the first source/drain contact 220A may be a backside source/drain contact and the second source/drain contact 220B may be a frontside source/drain contact. In this case, the frontside interconnect structure may have been formed on the second source/drain contact 220B in an operation prior to forming the first source/drain contact 220A. As such, the conductive TSL 450 may be formed following formation of the second source/drain contact 220B as described with reference to FIGS. 3A-3D, namely with the second source/drain contact 220B in place. Then, the remaining metal layer(s) of the backside interconnect structure may be formed over the first source/drain contact 220A following formation of the conductive TSL 450.

In some embodiments, the oblique portion 410X is grown through air or open space that is in a vacuum environment. As such, one or more etch operations may be performed prior to forming the oblique portion 410X that remove material between the first and second source/drain contacts 220A, 220B. Following formation of the oblique portion 410X, a dielectric material may be deposited in the space to wrap around the oblique portion 410X. The dielectric material may electrically isolate the oblique portion 410X from adjacent structures and may provide physical support that is beneficial to prevent breakage of the oblique portion 410X.

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor. The CFET includes an isolation structure positioned between the lowest semiconductor nanostructure of the first transistor and the highest semiconductor nanostructure of the second transistor. The CFET includes a conductive through-substrate layer (TSL) that has an oblique portion which reduces parasitic capacitance. This helps ensure that the conductive TSL will not unduly increase parasitic capacitance with nearby gate metal and/or source/drain regions. The conductive TSL having the oblique portion is formed using a single patterning and etch loop, which simplifies formation of the conductive TSL and reduces cost.

In some embodiments, a device includes: a complementary transistor including: a first transistor having a first source/drain region; and a second transistor above the first transistor in a vertical direction, and having a second source/drain region, the second transistor being offset from the first transistor in a first direction that is perpendicular to the vertical direction; a first source/drain contact electrically coupled to the first source/drain region; a second source/drain contact electrically coupled to the second source/drain region; and an interconnect structure electrically coupled to the first source/drain contact and the second source/drain contact, and including an oblique portion that extends from the first source/drain contact to the second source/drain contact at an offset angle from the vertical direction.

In some embodiments, a method includes: forming a first transistor and a second transistor on a substrate, the second transistor being stacked on the first transistor in a vertical direction, the second transistor being offset from the first transistor along a first direction that is perpendicular to the vertical direction; forming a first source/drain contact in contact with a first source/drain region of the first and second transistors; forming a second source/drain contact in contact with a second source/drain region of the first and second transistors, the second source/drain region being offset from the first source/drain region along the vertical direction and the first direction; and forming an interconnect structure, including: forming a vertical portion of an opening in the first source/drain contact; forming an oblique portion of the opening by extending the opening from the first portion along an offset angle to a depth associated with the second source/drain contact; and forming an oblique conductive portion and a vertical conductive portion in the opening.

In some embodiments, a method includes: forming a first transistor and a second transistor on a substrate, the second transistor being stacked on the first transistor in a vertical direction, the second transistor being offset from the first transistor along a first direction that is perpendicular to the vertical direction; forming a first source/drain contact in contact with a first source/drain region of the first and second transistors; forming a second source/drain contact in contact with a second source/drain region of the first and second transistors, the second source/drain region being offset from the first source/drain region along the vertical direction and the first direction; and forming an interconnect structure, including: forming an opening in the first source/drain contact; forming a seed layer in the opening; and forming an oblique portion on the seed layer, the oblique portion being grown by a directional deposition operation at an offset angle from the vertical direction toward a position associated with the second source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a complementary transistor including:
    a first transistor having a first source/drain region; and
    a second transistor above the first transistor in a vertical direction, and having a second source/drain region, the second transistor being offset from the first transistor in a first direction that is perpendicular to the vertical direction;
a first source/drain contact electrically coupled to the first source/drain region;
a second source/drain contact electrically coupled to the second source/drain region; and
an interconnect structure electrically coupled to the first source/drain contact and the second source/drain contact, and including an oblique portion that extends from the first source/drain contact to the second source/drain contact at an offset angle from the vertical direction.

2. The device of claim 1, wherein the interconnect structure further includes a vertical portion that extends through the first source/drain contact.

3. The device of claim 1, wherein the oblique portion is a different material than the first source/drain contact.

4. The device of claim 3, wherein the oblique portion is ruthenium.

5. The device of claim 1, further comprising a metal-to-metal interface between the second source/drain contact and the oblique portion.

6. The device of claim 1, wherein the offset angle is in a range of about 10 degrees to about 40 degrees.

7. The device of claim 1, wherein the offset angle is in a range of about 40 degrees to about 70 degrees.

8. The device of claim 1, wherein one of the first and second source/drain regions is N-type and the other of the first and second source/drain regions is P-type.

9. The device of claim 1, wherein the first source/drain contact is a backside source/drain contact and the second source/drain contact is a frontside source/drain contact.

10. The device of claim 1, wherein the oblique portion is cylinder shaped.

11. A device comprising:

a first source/drain contact electrically coupled to a first source/drain region;

a second source/drain contact electrically coupled to a second source/drain region; and an interconnect structure electrically coupled to the first source/drain contact and the second source/drain contact, the interconnect structure includes an oblique portion that extends from the first source/drain contact to the second source/drain contact at an offset angle from the vertical direction.

12. The device of claim 11, wherein the oblique portion has a cylindrical shape.

13. The device of claim 11, wherein the oblique portion has a conical shape.

14. The device of claim 11, wherein the oblique portion is tapered.

15. The device of claim 11, wherein the first source/drain contact is a backside source/drain contact and the second source/drain contact is a frontside source/drain contact.

16. The device of claim 11, wherein:

the first source/drain contact is made of a first material;

the second source/drain contact is made of a second material; and the oblique portion of the interconnect structure is made of a third material different from the first material and the second material.

17. The device of claim 16, wherein the first material and the second material are the same.

18. A device, comprising:

a structure of stacked layers including a first side and a second side opposite to the first side;

a first transistor within the structure of stacked layers, the first transistor including a first source/drain region;

a first source/drain contact electrically coupled to the first source/drain region;

a second transistor within the structure of stacked layers, the second transistor including a second source/drain region;

a second source/drain contact electrically coupled to the second source/drain region; and an interconnect structure in the structure of stacked layers and electrically coupled to the first source/drain contact and the second source/drain contact, the interconnect structure includes an oblique portion that extends through the structure of stacked layers from the first source/drain contact to the second source/drain contact at an offset angle from the vertical direction, and the angle is transverse to the first side and the second side of the structure of stacked layers.

19. The device of claim 18, wherein the oblique portion is tapered.

20. The device of claim 18, wherein the oblique portion has a cylindrical shape.

\* \* \* \* \*